(12) United States Patent
Kim et al.

(10) Patent No.: US 11,552,179 B2
(45) Date of Patent: Jan. 10, 2023

(54) SEMICONDUCTOR DEVICE

(71) Applicant: Samsung Electronics Co., Ltd., Suwon-si (KR)

(72) Inventors: Hyunsu Kim, Suwon-si (KR); Seonghun Park, Hwaseong-si (KR); Sunjung Lee, Hwaseong-si (KR); Hun Kim, Yongin-si (KR); Namgil You, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 182 days.

(21) Appl. No.: 16/893,795

(22) Filed: Jun. 5, 2020

(65) Prior Publication Data

US 2021/0104615 A1    Apr. 8, 2021

(30) Foreign Application Priority Data

Oct. 2, 2019    (KR) .................... 10-2019-0122522

(51) Int. Cl.
*H01L 23/532*        (2006.01)
*H01L 27/11526*    (2017.01)
(Continued)

(52) U.S. Cl.
CPC .......... *H01L 29/4975* (2013.01); *G11C 5/025* (2013.01); *H01L 23/53209* (2013.01);
(Continued)

(58) Field of Classification Search
CPC ......... H01L 27/11521; H01L 27/11529; H01L 27/11551; H01L 27/11557; H01L 27/11578; H01L 27/11526; H01L 27/11534; H01L 27/11573; H01L 27/11582; H01L 21/76841; H01L 21/76846; H01L 21/76847;
(Continued)

(56) References Cited

U.S. PATENT DOCUMENTS 6,331,485 B1    12/2001  Miyamoto
7,981,794 B2    7/2011   Narushima et al.
(Continued)

FOREIGN PATENT DOCUMENTS

KR    10-2008-0003641 A    1/2008
KR    10-2011-0131703 A    12/2011

*Primary Examiner* — Thanhha S Pham
(74) *Attorney, Agent, or Firm* — Harness, Dickey & Pierce, P.L.C.

(57) ABSTRACT

A semiconductor device includes a peripheral circuit region comprising a first substrate, circuit elements on the first substrate, a first insulating layer covering the circuit elements, and a contact plug passing through the first insulating layer and disposed to be connected to the first substrate; and a memory cell region comprising a second substrate, gate electrodes on the second substrate and stacked in a vertical direction, and channel structures passing through the gate electrodes, wherein the contact plug comprises a metal silicide layer disposed to contact the first substrate and having a first thickness, a first metal nitride layer on the metal silicide layer to contact the metal silicide layer and having a second thickness, greater than the first thickness, a second metal nitride layer on the first metal nitride layer, and a conductive layer on the second metal nitride layer.

16 Claims, 26 Drawing Sheets

(51) Int. Cl.
*H01L 27/11534* (2017.01)
*H01L 27/11521* (2017.01)
*H01L 27/11529* (2017.01)
*H01L 29/49* (2006.01)
*G11C 5/02* (2006.01)

(52) U.S. Cl.
CPC .. *H01L 27/11521* (2013.01); *H01L 27/11526* (2013.01); *H01L 27/11529* (2013.01); *H01L 27/11534* (2013.01)

(58) Field of Classification Search
CPC ......... H01L 21/76856; H01L 21/28518; H01L 21/32051; H01L 21/32053; H01L 23/53209; H01L 21/76843
See application file for complete search history.

(56) References Cited

U.S. PATENT DOCUMENTS

| | | |
|---|---|---|
| 8,785,310 B2 | 7/2014 | Hasegawa et al. |
| 9,349,642 B2 | 5/2016 | Murakami et al. |
| 2010/0216304 A1 | 8/2010 | Tada et al. |
| 2018/0308709 A1 | 10/2018 | Yamasaki et al. |
| 2019/0267333 A1* | 8/2019 | Hong ................ H01L 27/11582 |
| 2021/0118676 A1* | 4/2021 | Kusumoto ........ H01L 21/76879 |

* cited by examiner

SEMICONDUCTOR DEVICE

CROSS-REFERENCE TO RELATED APPLICATION

This application claims benefit of priority to Korean Patent Application No. 10-2019-0122522 filed on Oct. 2, 2019 in the Korean Intellectual Property Office, the disclosure of which is incorporated herein by reference in its entirety.

BACKGROUND

The present inventive concepts relate to a semiconductor device.

As demands for high performance, high speed, and/or multifunction of a semiconductor device increase, a degree of integration of the semiconductor device is increasing. In manufacturing a semiconductor device having a relatively fine pattern, corresponding to a higher integration trend of a semiconductor device, it may be beneficial to implement patterns having a relatively fine width and/or a relatively fine separation distance. Therefore, efforts have been made to secure contact resistance at ends of contact plugs electrically connecting wiring structures and semiconductor elements. In addition, as one method for improving a degree of integration of a semiconductor device, a semiconductor device having a vertical transistor structure, instead of a conventional planar transistor structure, has been proposed.

SUMMARY

An aspect of the present inventive concepts is to provide a semiconductor device having improved reliability.

According to an aspect of the present inventive concepts, a semiconductor device includes a peripheral circuit region comprising a first substrate, circuit elements on the first substrate, a first insulating layer covering the circuit elements, and a contact plug passing through at least a portion of the first insulating layer on a side of the circuit elements and disposed to be connected to the first substrate; and a memory cell region comprising a second substrate above the first substrate, gate electrodes on the second substrate, spaced apart from each other, and stacked in a vertical direction, and channel structures passing through the gate electrodes and extending perpendicularly to an upper surface of the second substrate, wherein the contact plug includes a metal silicide layer disposed to contact the first substrate and having a first thickness, a first metal nitride layer on the metal silicide layer to contact the metal silicide layer and having a second thickness, greater than the first thickness, a second metal nitride layer on the first metal nitride layer, and a conductive layer on the second metal nitride layer.

According to an aspect of the present inventive concepts, a semiconductor device includes a peripheral circuit region comprising a first substrate, circuit elements on the first substrate, a first insulating layer covering the circuit elements, and a first contact plug passing through at least a portion of the first insulating layer on a side of the circuit elements and disposed to be connected to the first substrate; and a memory cell region comprising a second substrate above the first substrate, memory cells on the second substrate and electrically connected to the circuit elements, a second insulating layer covering the memory cells, and a second contact plug passing through at least a portion of the second insulating layer and electrically connected to the memory cells, wherein at least one of the first contact plug and the second contact plug includes a metal silicide layer having a first thickness, a metal nitride layer on the metal silicide layer to contact the metal silicide layer and having a second thickness, greater than the first thickness, and a conductive layer on the metal nitride layer.

According to an aspect of the present inventive concepts, a semiconductor device includes a first conductive layer comprising a semiconductor material; a second conductive layer on the first conductive layer; and a contact plug connecting the first conductive layer and the second conductive layer and disposed to fill a contact hole, wherein the contact plug includes a metal silicide layer disposed to contact the first conductive layer and having a first thickness, a first metal nitride layer on the metal silicide layer to contact the metal silicide layer and having a second thickness, greater than the first thickness, a second metal nitride layer on the first metal nitride layer, and a third conductive layer on the second metal nitride layer to fill the contact hole and including a metal material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described with reference to the accompanying drawings.

When the words "about" and "substantially" are used in this application in connection with a numerical value, it is intended that the associated numerical value include a tolerance of ±10% around the stated numerical value, unless otherwise explicitly defined.

Figure 1:
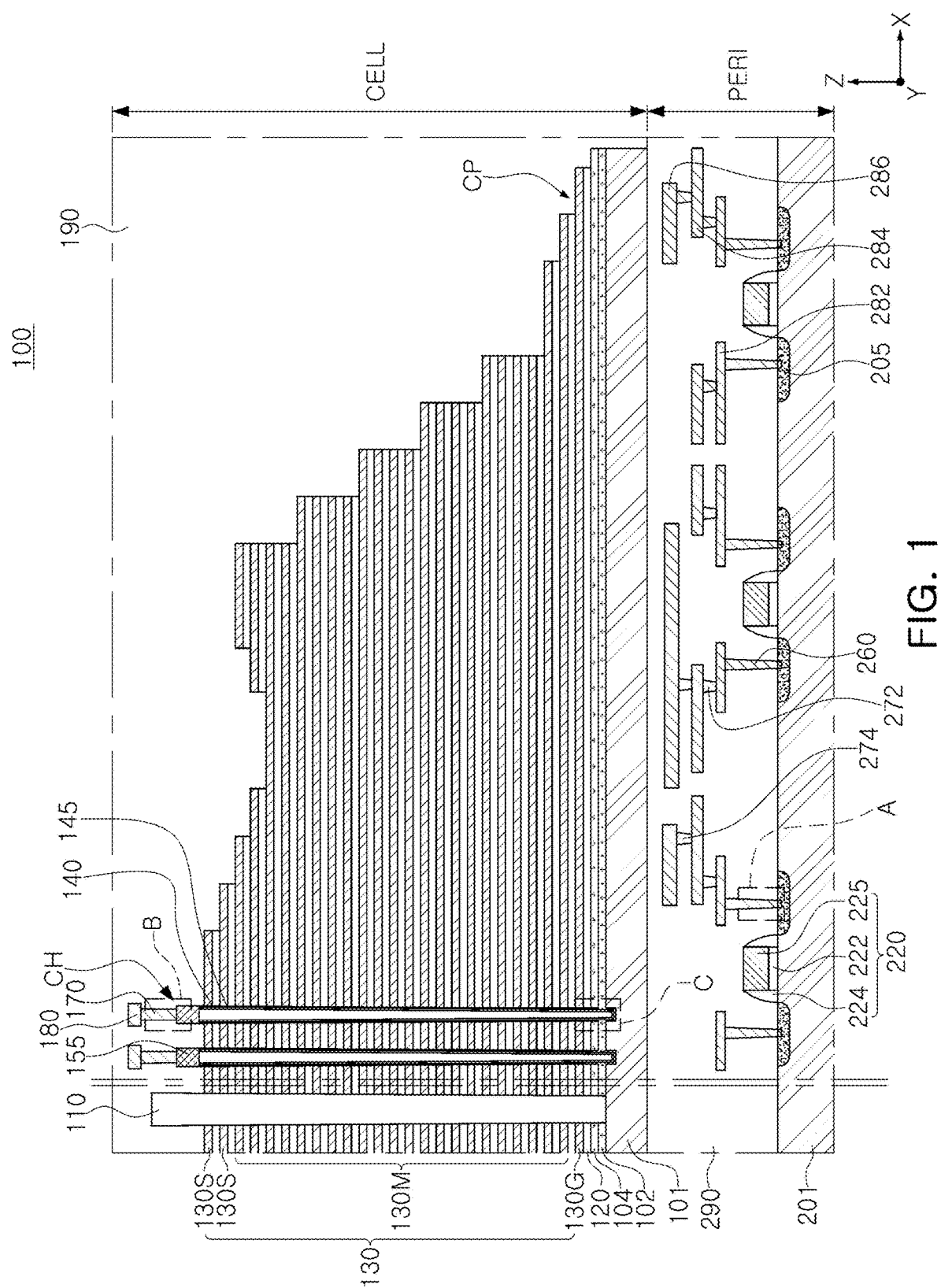
FIG. 1 is a cross-sectional view schematically illustrating a semiconductor device according to example embodiments.

FIG. 1 is a cross-sectional view schematically illustrating a semiconductor device according to example embodiments.

Figure 2A:
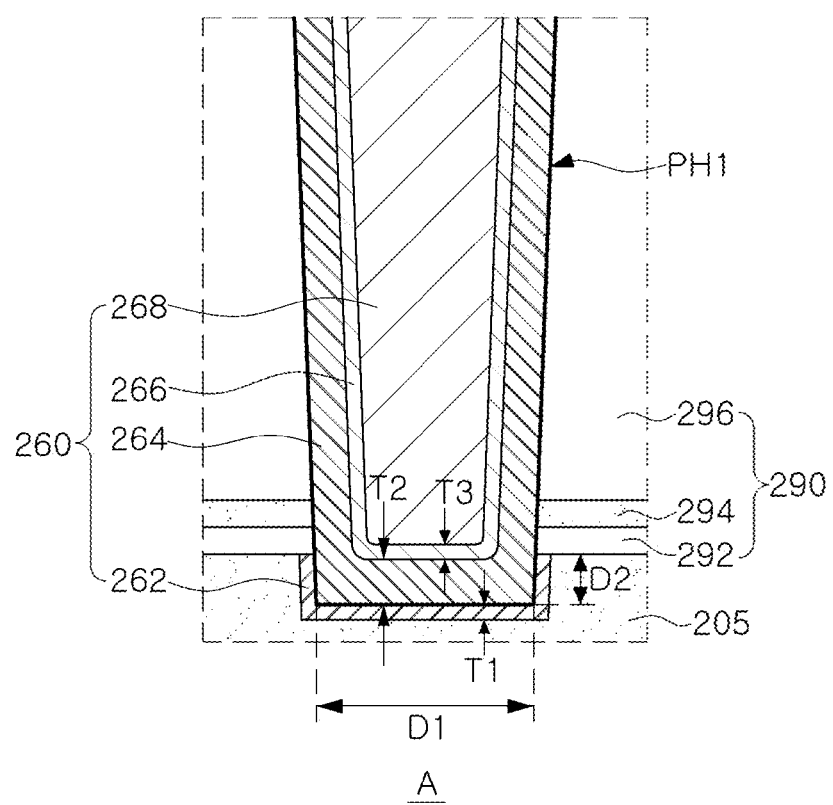
FIGS. 2A to 2C are enlarged views schematically illustrating a semiconductor device according to example embodiments.
Figure 2B:
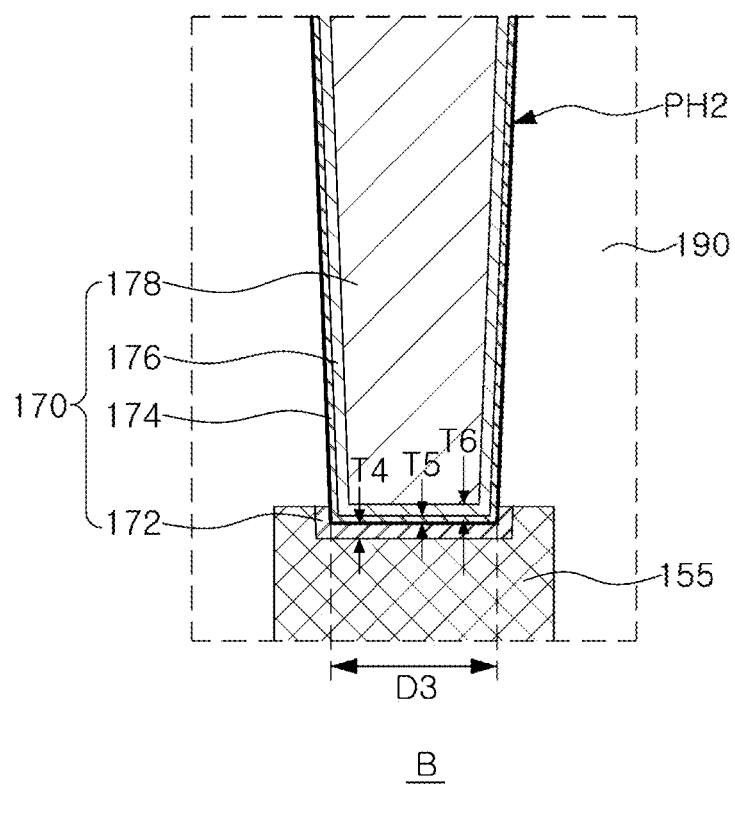
Figure 2C:
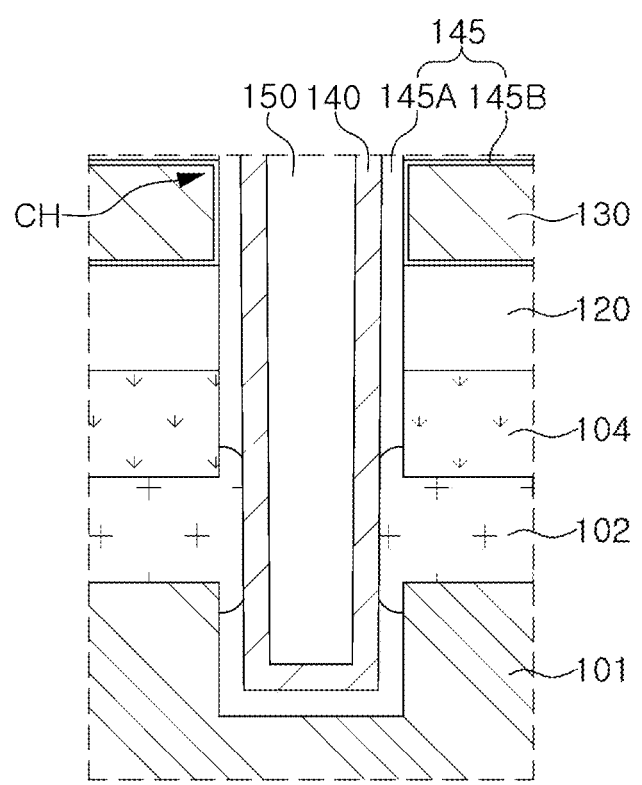

FIGS. 2A to 2C are enlarged views schematically illustrating a semiconductor device according to example embodiments. FIGS. 2A to 2C are enlarged views illustrating portion 'A', portion 'B', and portion 'C' of FIG. 1, respectively.

Referring to FIGS. 1 to 2C, a semiconductor device 100 may include a peripheral circuit region PERI provided on a base substrate 201, and a memory cell region CELL provided on a substrate 101. The memory cell region CELL may be disposed on an upper end of the peripheral circuit region PERI. In example embodiments, the memory cell region CELL may be disposed on a lower end of the peripheral circuit region PERI.

The peripheral circuit region PERI may include the base substrate 201, and circuit elements 220, first to third contact plugs 260, 272, and 274, and/or first to third circuit wiring lines 282, 284, and 286, arranged on the base substrate 201.

The base substrate 201 may have an upper surface extending in an x direction and a y direction. In the base substrate 201, isolation layers may be formed to define an active region. Source/drain regions 205 including impurities may be disposed in a portion of the active region. The base substrate 201 may include a semiconductor material, such as a group IV semiconductor, a group III-V compound semiconductor, or a group II-VI compound semiconductor. The base substrate 201 may be provided as a bulk wafer or an epitaxial layer.

The circuit elements 220 may include planar transistors. Each of the circuit elements 220 may include a circuit gate dielectric layer 222, spacer layers 224, and/or a circuit gate electrode 225. The source/drain regions 205 may be disposed in the base substrate 201 at both sides of the circuit gate electrode 225. The circuit gate dielectric layer 222 may include silicon oxide, and the circuit gate electrode 225 may include a conductive material such as metal, polycrystalline silicon, or metal silicide. The spacer layers 224 may be disposed on both side walls of the circuit gate dielectric layer 222 and the circuit gate electrode 225, and may include, for example, silicon nitride.

A peripheral region insulating layer 290 may be disposed on the base substrate 201 and may be disposed on the circuit elements 220 to cover the circuit elements 220. The peripheral region insulating layer 290 may be made of an insulating material. The peripheral region insulating layer 290 may include first to third insulating layers 292, 294, and 296, as illustrated in FIG. 2A. The first insulating layer 292 may be a layer extending from the circuit gate dielectric layers 222. The second insulating layer 294 may be a layer used as an etch stop layer when forming the first contact plugs 260. The third insulating layer 296 may be a layer formed on the second insulating layer 294 to cover the circuit elements 220. In example embodiments, the third insulating layer 296 may include a plurality of layers formed in different process operations.

The first to third contact plugs 260, 272, and 274 may pass through the peripheral region insulating layer 290, and may be connected to the source/drain regions 205. The first to third contact plugs 260, 272, and 274 may be sequentially stacked from the base substrate 201, and an electrical signal may be applied to the circuit elements 220 by the first to third contact plugs 260, 272, and 274.

The first contact plug 260 may pass through a portion of the peripheral region insulating layer 290, and may be connected to the source/drain regions 205 in the base substrate 201. As illustrated in FIG. 2A, the first contact plug 260 may be disposed to fill a first contact hole PH1 passing through a portion of the peripheral region insulating layer 290. The first contact hole PH1 may have a shape in which a lower end recesses the base substrate 201 and the source/drain region 205. A diameter D1 and a recess depth D2 of the lower end of the first contact hole PH1 may be variously changed according to example embodiments. For example, the diameter D1 of the lower end of the first contact hole PH1 may range from 40 nm to 150 nm. The first contact plug 260 may include a metal silicide layer 262, a first metal nitride layer 264, a second metal nitride layer 266, and a conductive layer 268, sequentially stacked from the source/drain region 205.

The metal silicide layer 262 may be an ohmic layer, and may be disposed to contact the base substrate 201, specifically, the source/drain region 205 of the base substrate 201. In example embodiments, the metal silicide layer 262 may be disposed to surround a bottom surface and a portion of an external side surface of the first contact hole PH1. The metal silicide layer 262 may include titanium silicide (TiSi), tungsten silicide (WSi), nickel silicide (NiSi), cobalt silicide (CoSi), or other metal silicides. In example embodiments, the metal silicide layers 262 may be a metal semiconductor layer including a semiconductor material other than silicon, depending on a material of the source/drain regions 205. The metal silicide layer 262 may be limited to being located in the base substrate 201, and may not extend above the base substrate 201. An uppermost surface of the metal silicide layer 262, for example, an upper surface of a region disposed on the external side surface of the first contact hole PH1 may be coplanar or substantially coplanar with the upper surface of the base substrate 201, and may be in contact with the first insulating layer 292. The metal silicide layer 262 may have a uniform or substantially uniform thickness. [29] The first metal nitride layer 264 may be disposed to extend from the metal silicide layer 262 above the base substrate 201 along an internal side wall of the first contact hole PH1. The first metal nitride layer 264 may be a nitride layer including the same metal element as the metal silicide layer 262. For example, the metal silicide layer 262 may be a silicide layer of a first metal, and the first metal nitride layer 264 may be a nitride layer of the first metal. For example, the metal silicide layer 262 may be a $TiSi_x$ layer, and the first metal nitride layer 264 may be a TiN layer.

The first metal nitride layer 264 may have a second thickness T2, greater than a first thickness T1 of the metal silicide layer 262. The thickness in the present specification, such as the first thickness T1 and the second thickness T2, may mean an average thickness unless otherwise described. A ratio T1/T2 of the first thickness T1 to the second thickness T2 may range from about 0.16 to about 0.80. For example, the second thickness T2 may be greater than twice the first thickness Ti. For example, the first thickness T1 may range from about 2% to about 10% of the diameter D1 of the lower end. In example embodiments, for example, the first thickness T1 may range from about 20 Å to about 100 Å, and the second thickness T2 may range from about 80 A to about 140 A.

The first contact plugs 260 may be formed by operations described below with reference to FIGS. 7A to 7F to have a thickness relationship between the metal silicide layer 262 and the first metal nitride layer 264, as mentioned above. As a result, the uniformity of the metal silicide layer 262 may be secured, so that even if several high temperature operations are subsequently performed after the first contact plugs 260 are formed, contact resistance of the first contact plugs 260 may be secured. This will be described in more detail with reference to FIGS. 7A to 7F below.

The second metal nitride layer 266 may be disposed on the first metal nitride layer 264 on the internal side wall of the first contact hole PH1. The second metal nitride layer 266 may have a third thickness T3, less than the second thickness T2 of the first metal nitride layer 264. According to example embodiments, the third thickness T3 may be equal to or greater than the second thickness T2. The second metal nitride layer 266 may include the same or different metal element as or from the first metal nitride layer 264. In example embodiments, even when the second metal nitride layer 266 has the same composition as the first metal nitride layer 264, the process operations related to each other may be different such that an interface between the first metal nitride layer 264 and the second metal nitride layer 266 may be preset and/or distinguished. For example, the first metal nitride layer 264 may be a layer formed by a nitridation process, and the second metal nitride layer 266 may be a layer formed by a chemical vapor deposition (CVD) process.

The conductive layer 268 may be disposed to partially or completely fill the first contact hole PH1. The conductive layer 268 may include a metal element, different from the metal silicide layer 262 and the first metal nitride layer 264, but is not limited thereto. For example, the conductive layer 268 may include tungsten (W), copper (Cu), or aluminum (Al).

The second and third contact plugs 272 and 274 may also be made of a conductive material, and may include a diffusion barrier layer and a conductive layer. For example, the diffusion barrier layer may include tungsten nitride (WN), tantalum nitride (TaN), titanium nitride (TiN), or a combination thereof. In a region not illustrated, separate contact plugs may also be connected to the circuit gate electrodes 225.

The first to third circuit wiring lines 282, 284, and 286 may be connected to the first to third contact plugs 260, 272, and 274. The first to third circuit wiring lines 282, 284, and 286 may include a metal, and may include, for example, tungsten (W), copper (Cu), or aluminum (Al). In example embodiments, the number of layers and the arrangement of the first to third contact plugs 260, 272, and 274 and the first to third circuit wiring lines 282, 284, and 286 may be variously changed.

The memory cell region CELL may include the substrate 101, gate electrodes 130 disposed on the substrate 101, spaced apart from each other, and stacked in a vertical direction, and channel structures CH passing through a stack structure of the gate electrodes 130, extending perpendicularly to an upper surface of the substrate 101, and having channel layers 140 disposed therein, and separation regions 110 passing through the stack structure of the gate electrodes 130 and extending in one direction. The memory cell region CELL may further include first and second horizontal conductive layers 102 and 104 disposed on the substrate 101, interlayer insulating layers 120 alternately stacked with the gate electrodes 130, channel contact plugs 170 on the channel structures CH, cell wiring lines 180 electrically connected to the channel layers 140, and a cell region insulating layer 190 covering the stack structure of the gate electrodes 130.

The substrate 101 may have an upper surface extending in the x direction and the y direction. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a polycrystalline silicon layer or an epitaxial layer.

The gate electrodes 130 may be disposed on the substrate 101, spaced apart from each other, and stacked in a vertical direction, to form a stack structure. In the gate electrodes 130, at least one lower gate electrode 130G in a lowermost portion may form a gate of a ground select transistor, and at least one upper gate electrode 130S in an uppermost portion may form a string select transistor, and memory gate electrodes 130M therebetween may form memory cells. The number of memory gate electrodes 130M constituting the memory cells may be determined according to capacity of the semiconductor device 100. In example embodiments, the lower gate electrode 130G and the upper gate electrode 130S may be provided, respectively, as one or two or more, and may have the same or different structure as or from the memory gate electrodes 130M. A portion of the gate electrodes 130 may be dummy gate electrodes.

The gate electrodes 130 may be stacked vertically spaced apart from each other on the substrate 101, and may extend in different lengths in the x and y directions to form a stepped structure. Due to the stepped structure, gate electrodes 130 in a lower portion may extend longer than gate electrodes 130 in an upper portion, to provide pad regions CP exposed in an upward direction. The gate electrodes 130 may be connected to separate gate contact plugs in the pad regions CP, and may be connected to wiring lines in an upper portion of the memory cell region CELL.

The gate electrodes 130 may be separated from each other at regular intervals in one direction by the separation regions 110 extending in one direction. The gate electrodes 130 between a pair of separation regions 110 may form a single memory block, but a range of the single memory block is not limited thereto. A portion of the gate electrodes 130, for example, the memory gate electrodes 130M, may form a single layer every memory block.

The gate electrodes 130 may include a metal material, such as tungsten (W). In example embodiments, the gate electrodes 130 may include polycrystalline silicon or a metal silicide material. In example embodiments, the gate electrodes 130 may further include a diffusion barrier layer. For example, the diffusion barrier layer may include tungsten nitride (WN), tantalum nitride (TaN), titanium nitride (TiN), or a combination thereof.

The interlayer insulating layers 120 may be disposed between the gate electrodes 130. In a similar manner to the gate electrodes 130, the interlayer insulating layers 120 may be disposed to be spaced apart from each other in a direction, perpendicular to the upper surface of the substrate 101. The interlayer insulating layers 120 may include an insulating material such as silicon oxide or silicon nitride.

The separation region 110 may be disposed to pass through the gate electrodes 130 and extend in one direction. For example, the separation region 110 may extend in the x direction, so that a region including the separation region 110 is shown as not continuous with a region on a right side in FIG. 1. A plurality of separation regions 110 may be disposed in parallel with each other. The separation region 110 may have a shape in which a width thereof decreases toward the substrate 101 due to a relatively high aspect ratio, but is not limited thereto, and may have a side surface, perpendicular to the upper surface of the substrate 101. The separation region 110 may extend to the upper surface of the substrate 101, but is not limited thereto. The separation region 110 may include an insulating material, such as silicon oxide, silicon nitride, or the like.

The channel structures CH may each form a single memory cell string, may be arranged in rows and columns, and may be spaced apart from each other. The channel structures CH may be arranged to form a grid pattern on a plane, or may be arranged in a zigzag shape in one direction. The channel structures CH may have a pillar shape and may have an inclined side surface that narrows closer to the substrate 101 according to an aspect ratio. The arrangement and the number of the channel structures CH may be variously changed, according to example embodiments.

The channel layer 140 may be disposed in the channel structures CH. In the channel structures CH, the channel layer 140 may be formed in an annular shape that surrounds a channel insulating layer 150 therein, but may have a pillar shape such as a cylindrical or prismatic pillar shape, not having the channel insulating layer 150 inside. As illustrated in FIG. 2C, a lower portion of the channel layer 140 may be connected to the first horizontal conductive layer 102. The channel layer 140 may include a semiconductor material such as polycrystalline silicon or single crystalline silicon, and the semiconductor material may be an undoped material or a material containing p-type or n-type impurities.

Channel pads 155 may be disposed on an upper portion of the channel layer 140 in the channel structures CH. The channel pads 155 may be disposed to cover an upper surface of the channel insulating layer 150 and to be electrically connected to the channel layer 140. Channel pads 155 may include, for example, doped polycrystalline silicon.

A gate dielectric layer 145 may be disposed between the gate electrodes 130 and the channel layer 140. The gate dielectric layer 145 may include first and second layers 145A and 145B as illustrated in FIG. 2C, and may include a tunneling layer, a charge storage layer, and/or a blocking layer, sequentially stacked from the channel layer 140. The first layer 145A may extend perpendicularly to the substrate 101 along the channel layer 140, and the second layer 145B may extend in a horizontal direction along the gate electrodes 130. For example, the first layer 145A may include the tunneling layer, the charge storage layer, and one region of the blocking layer, and the second layer 145B may include remaining region of the blocking layer. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or a combination thereof.

The first and second horizontal conductive layers 102 and 104 may be stacked on the upper surface of the substrate 101. At least a portion of the first and second horizontal conductive layers 102 and 104 may function as a common source line of the semiconductor device 100, and may function as a common source line together with the substrate 101. The first horizontal conductive layer 102 may be directly connected to the channel layer 140 around the channel layer 140. The first and second horizontal conductive layers 102 and 104 may include a semiconductor material, for example, polycrystalline silicon. In example embodiments, at least the first horizontal conductive layer 102 may be a doped layer, and the second horizontal conductive layer 104 may be a doped layer or a layer including impurities diffused from the first horizontal conductive layer 102.

The channel contact plugs 170 may be disposed on the channel structures CH to electrically connect the cell wiring lines 180 and the channel layers 140. As illustrated in FIG. 2B, the channel contact plug 170 may be disposed to fill a second contact hole PH2 passing through a portion of the cell region insulating layer 190. The second contact hole PH2 may have a shape in which a lower end recesses the channel pad 155. A diameter D3 of the lower end of the second contact hole PH2 may be similar to or less than the diameter D1 of the lower end of the first contact hole PH1, but is not limited thereto. The channel contact plug 170 may include a metal silicide layer 172, a first metal nitride layer 174, a second metal nitride layer 176, and a conductive layer 178, sequentially stacked from the channel pad 155. For example, the channel contact plug 170 may have a stack structure similar to that of the first contact plug 260, but as described below, a thickness relationship between the layers may be different from that of the first contact plug 260.

The metal silicide layer 172 may be an ohmic layer, and may be disposed to contact the channel pad 155. In example embodiments, the metal silicide layer 172 may be disposed to surround a bottom surface and a portion of an external side surface of the second contact hole PH2, but is not limited thereto. For example, the metal silicide layer 172 may have a shape protruded inwardly from the bottom surface and the external side surface of the second contact hole PH2 with a predetermined or alternatively, desired thickness. The metal silicide layer 172 may include titanium silicide (TiSi), tungsten silicide (WSi), nickel silicide (NiSi), cobalt silicide (CoSi), or other metal silicides.

The first metal nitride layer 174 may be disposed to extend from the metal silicide layer 172 in an upper direction along an internal side wall of the second contact hole PH2. The first metal nitride layer 174 may be a nitride layer including the same metal element as the metal silicide layer 172. For example, the metal silicide layer 172 may be a silicide layer of a first metal, and the first metal nitride layer 174 may be a nitride layer of the first metal. For example, the metal silicide layer 172 may be a $TiSi_x$ layer, and the first metal nitride layer 174 may be a TiN layer. The first metal nitride layer 174 may have a fifth thickness T5, less than a fourth thickness T4 of the metal silicide layer 172. For example, a ratio T4/T5 of the fourth thickness T4 to the fifth thickness T5 may range from about 2 to about 8.

The second metal nitride layer 176 may be disposed on the first metal nitride layer 174 on the internal side wall of the second contact hole PH2. The second metal nitride layer 176 may have a sixth thickness T6, greater than the fifth thickness T5 of the first metal nitride layer 174. According to example embodiments, the sixth thickness T6 may be equal to or less than the fifth thickness T5. The second metal nitride layer 176 may include the same or different metal element as or from the first metal nitride layer 174. In example embodiments, even when the second metal nitride layer 176 has the same composition as the first metal nitride layer 174, the process operations related to each other may be different such that an interface between them may be distinguished. For example, the first metal nitride layer 174 may be a layer formed by the nitridation process, and the second metal nitride layer 176 may be a layer formed by a CVD process.

The conductive layer 178 may be disposed to partially or completely fill the second contact hole PH2. The conductive layer 178 may include a metal element, different from the metal silicide layer 172 and the first metal nitride layer 174, but is not limited thereto. For example, the conductive layer 178 may include tungsten (W), copper (Cu), or aluminum (Al).

The channel contact plugs 170 may go through a lesser number of subsequent high temperature operations than the first contact plugs 260, during a manufacturing process. Therefore, the channel contact plugs 170 may be formed by operations different from that of the first contact plugs 260, so that a thickness relationship between the metal silicide layer 172 and the first metal nitride layer 174 may be different than the first contact plugs 260.

The cell wiring lines 180 may be disposed on the channel contact plugs 170, and may be connected to wiring structures in a region, not illustrated, in an upper portion of the memory cell region CELL. The cell wiring lines 180 may be a layer corresponding to or electrically connected to a bit line of the semiconductor device 100. The cell wiring lines 180 may have a form extending in the y direction, and for example, may extend perpendicularly to the separation region 110. The cell wiring lines 180 may be made of a conductive material, and may include, for example, tungsten (W), copper (Cu), or aluminum (Al).

The cell region insulating layer 190 may be disposed to cover the substrate 101, the gate electrodes 130 on the substrate 101, and the peripheral region insulating layer 290 in a region in which the substrate 101 is not disposed. The cell region insulating layer 190 may include an insulating material such as silicon oxide, silicon nitride, or the like.

Figure 3A:
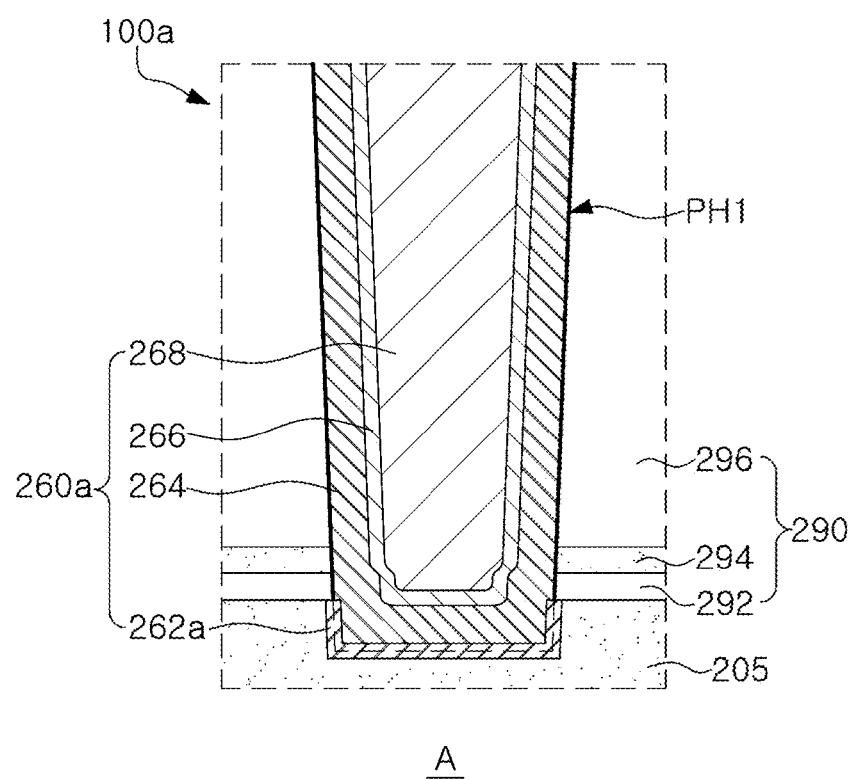
FIGS. 3A to 3C are partially enlarged views illustrating a semiconductor device according to example embodiments.
Figure 3B:
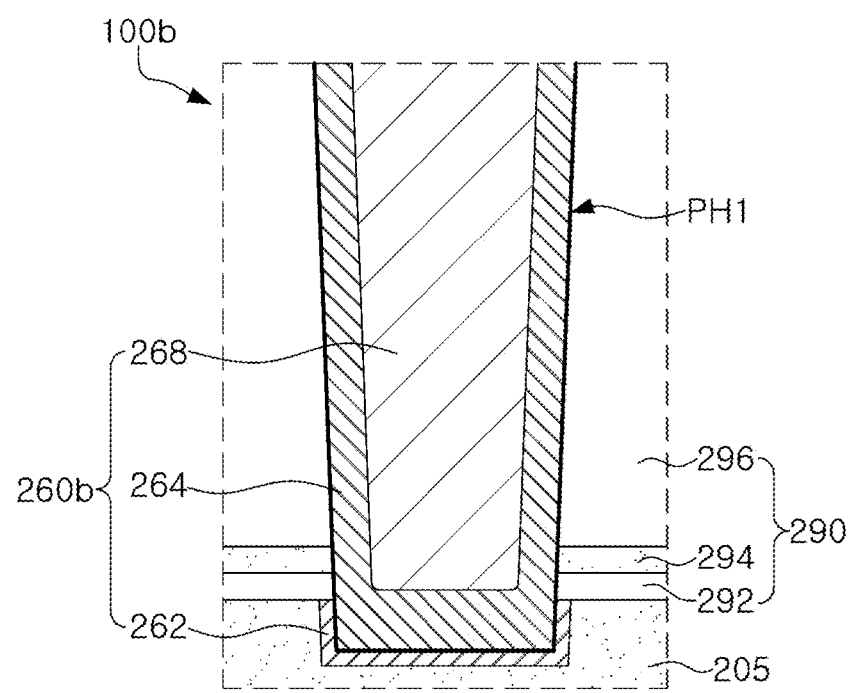
Figure 3C:
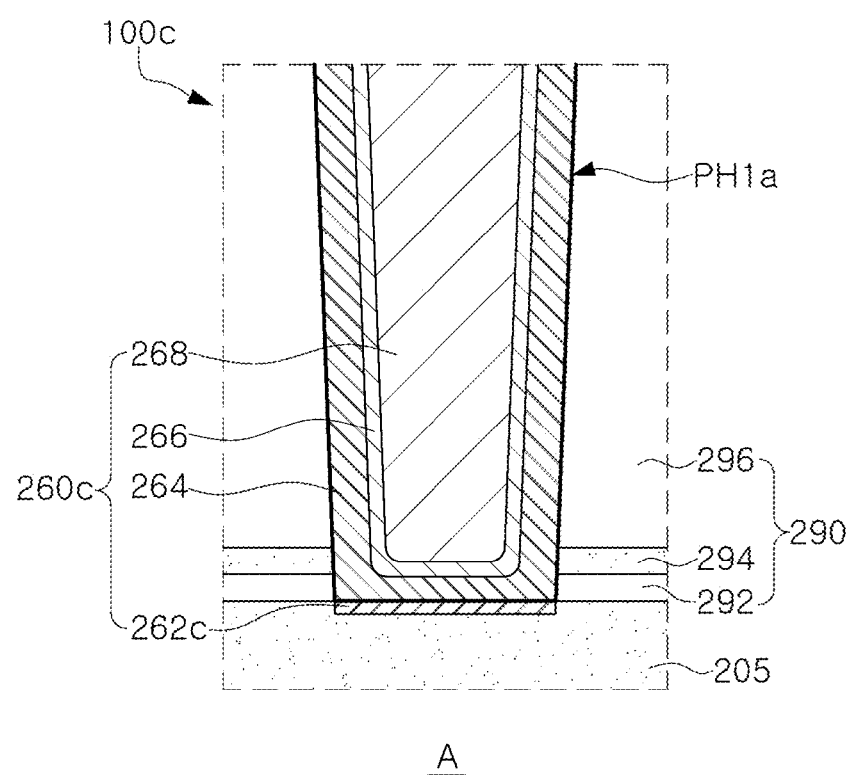

FIGS. 3A to 3C are partially enlarged views illustrating a semiconductor device according to example embodiments. FIGS. 3A to 3C are enlarged views illustrating a region corresponding to portion 'A' of FIG. 1.

Referring to FIG. 3A, in a semiconductor device 100a, a metal silicide layer 262a of a first contact plug 260a may be disposed to have a predetermined or alternatively, desired thickness on the bottom and side surfaces of a first contact hole PH1 not only in an outward direction but also in an inward direction. Therefore, an internal side surface of the metal silicide layer 262a may protrude toward a first metal nitride layer 264, such that a bent portion of the first metal nitride layer 264 may be formed in an upper end of the metal silicide layer 262a. Such a structure may be due to relative diffusivity of a metal element of the metal silicide layer 262a and a silicon (Si) element of a source/drain region 205, and the like, when the metal silicide layer 262a is formed. Therefore, an internal side surface of the first metal nitride layer 264, and a region of a second metal nitride layer 266, corresponding thereto, may also have bent portions, but are not limited thereto.

Referring to FIG. 3B, in a semiconductor device 100b, a first contact plug 260b may include a metal silicide layer 262, a metal nitride layer 264, and a conductive layer 268, sequentially stacked from a source/drain region 205. For example, in a different manner to the example embodiments of FIG. 2A, the first contact plug 260b of example embodiments of FIG. 3B may include only one metal nitride layer, without including the second metal nitride layer 266. As such, when there is less likelihood of damage to an underlying layer, or the like, during formation of the conductive layer 268 according to material and formation operations of the conductive layer 268, a second metal nitride layer 266 may be omitted.

Referring to FIG. 3C, in a semiconductor device 100c, a first contact hole PH1a may be formed not to recess a source/drain region 205. In example embodiments, in first contact plugs 260c, a metal silicide layer 262c may be disposed below a bottom surface of the first contact hole PH1a, or may be disposed above and below the bottom surface of the first contact hole PH1a, in a similar manner to FIG. 3A. Even in example embodiments, a thickness of a first metal nitride layer 264 may be greater than a thickness of the metal silicide layer 262c.

Figure 4A:
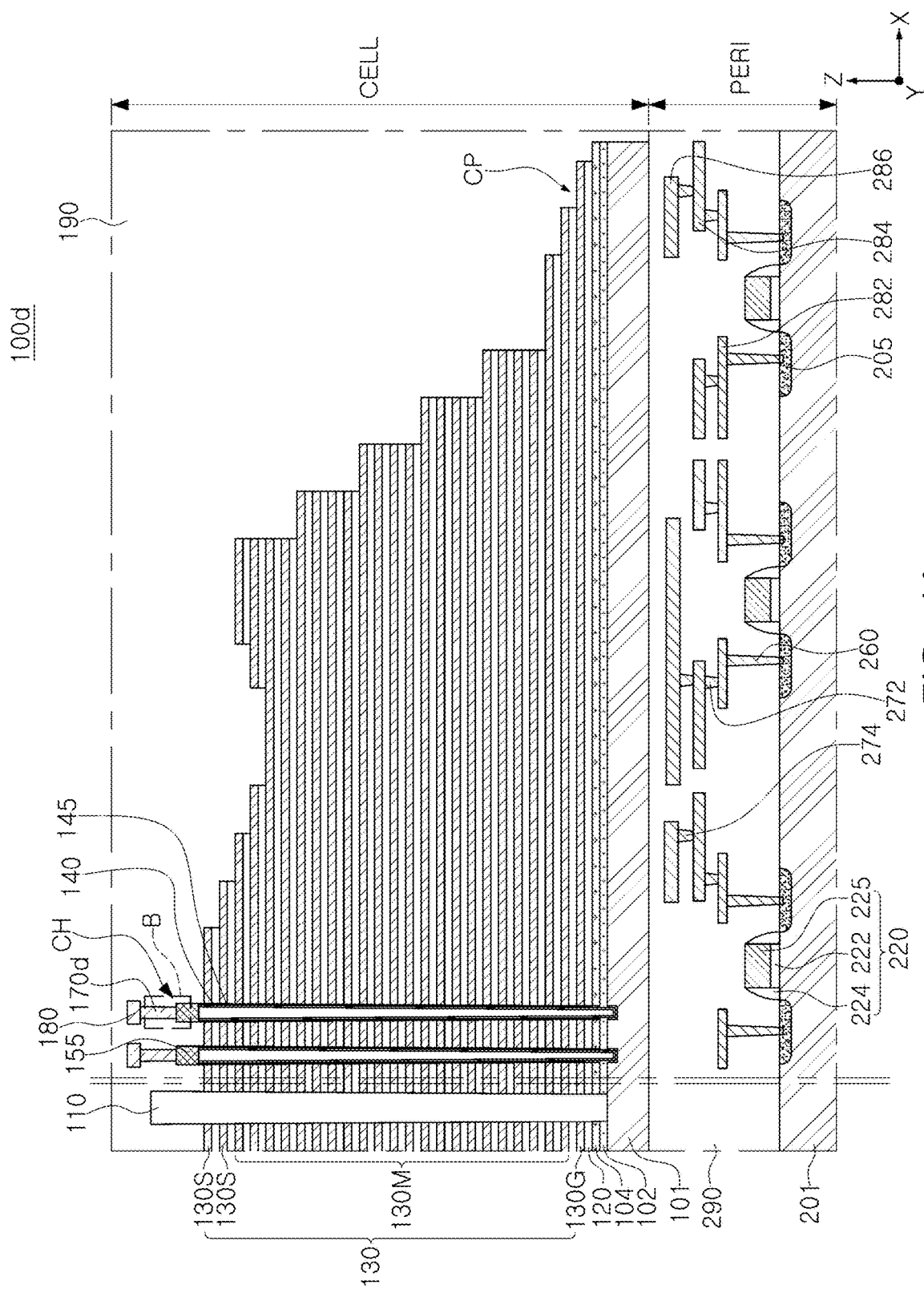
FIGS. 4A and 4B are cross-sectional and partially enlarged views schematically illustrating a semiconductor device according to example embodiments.
Figure 4B:
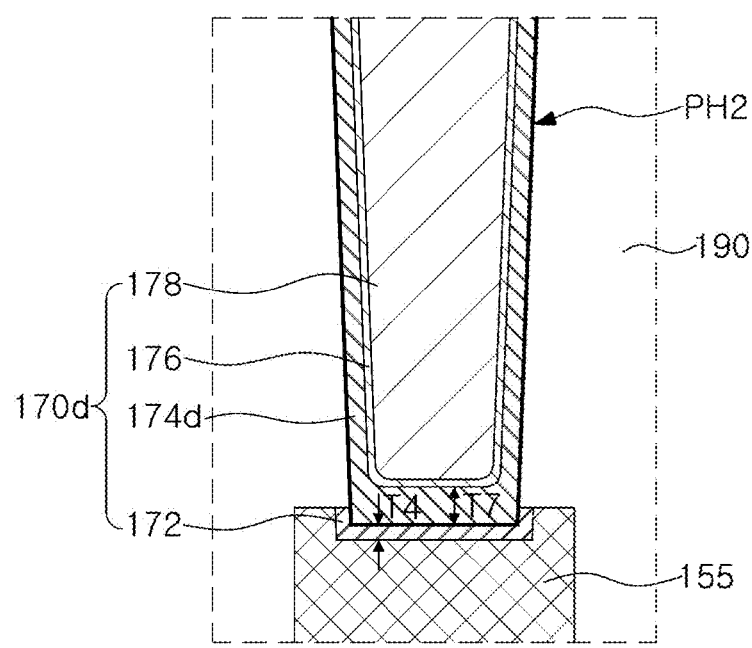

FIGS. 4A and 4B are cross-sectional and partially enlarged views schematically illustrating a semiconductor device according to example embodiments. FIG. 4B is an enlarged view of portion 'B' of FIG. 4A.

Referring to FIGS. 4A and 4B, in a memory cell region CELL of a semiconductor device 100d, a channel contact plug 170d may include a metal silicide layer 172, a first metal nitride layer 174d, a second metal nitride layer 176, and/or a conductive layer 178, sequentially stacked from a channel pad 155.

The first metal nitride layer 174d may have a seventh thickness T7, greater than a fourth thickness T4 of the metal silicide layer 172. For example, a ratio T4/T7 of the fourth thickness T4 to the seventh thickness T7 may range from about 0.16 to about 0.80. The second metal nitride layer 176 may have a thickness, less than the first metal nitride layer 174d, but is not limited thereto. Therefore, in the semiconductor device 100d, the channel contact plugs 170d may have the same or substantially the same stack structure as first contact plugs 260. For example, the channel contact plugs 170d and the first contact plugs 260 may have the same or substantially the same number and type of stacked layers, the same or substantially the same stacking order, and the same or substantially the same relative thickness relationship.

Figure 5A:
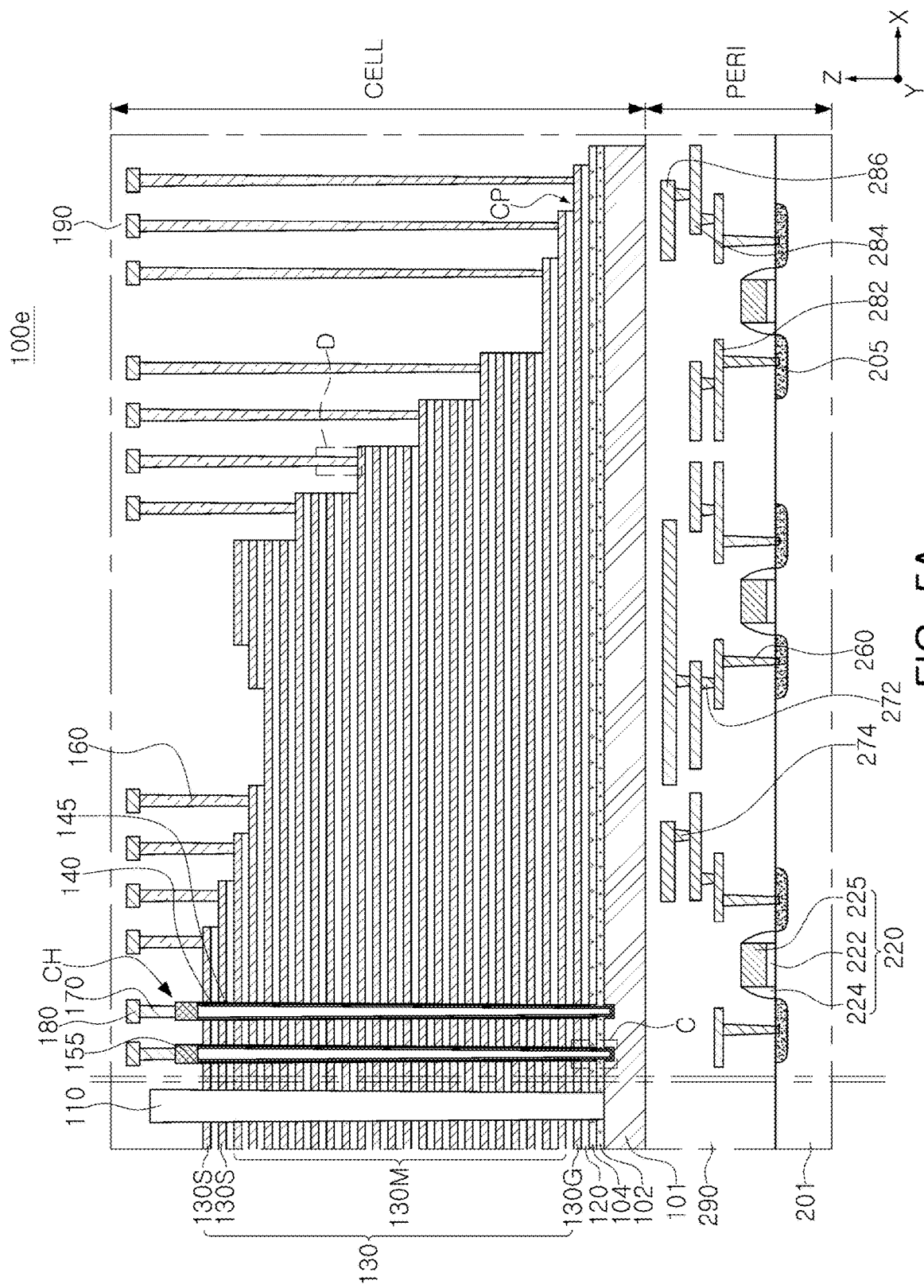
FIGS. 5A to 5C are cross-sectional views schematically illustrating semiconductor devices according to example embodiments.
Figure 5B:
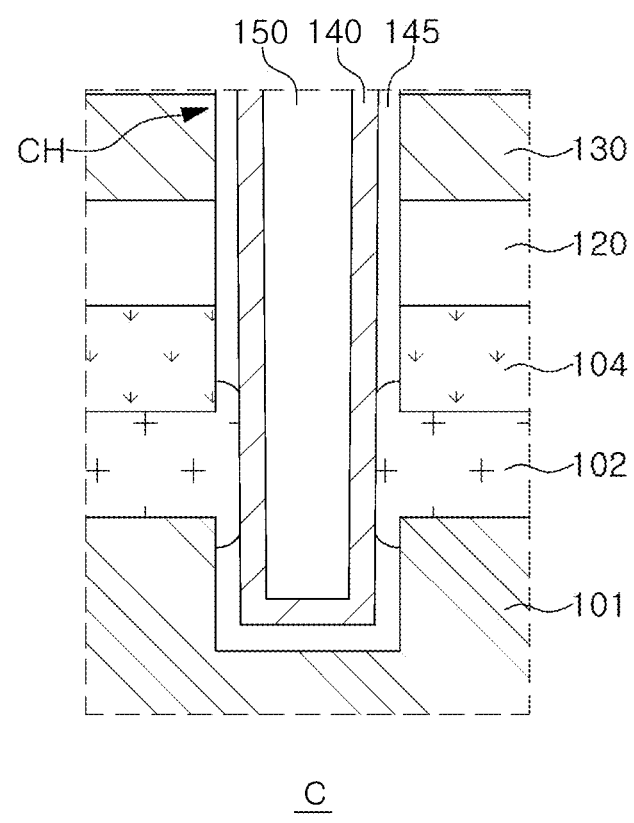
Figure 5C:
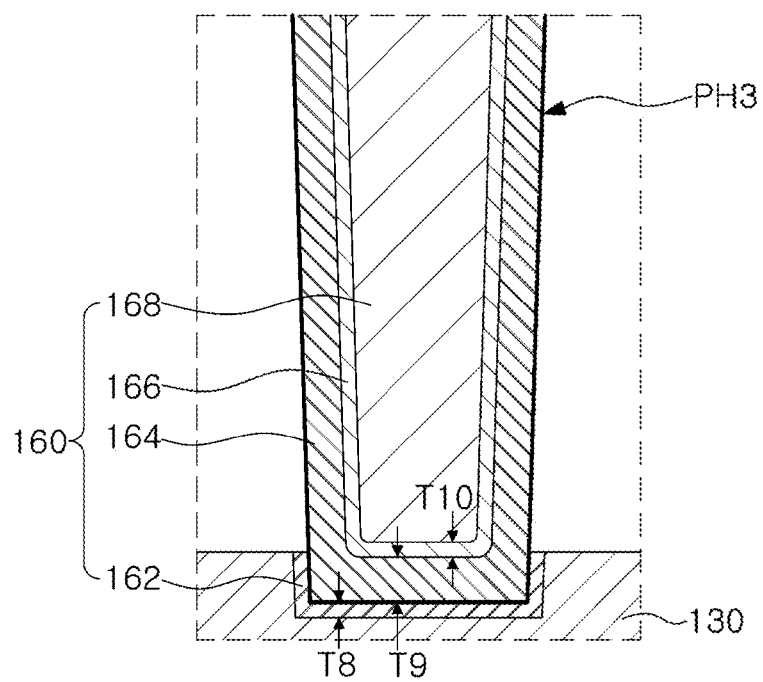

FIGS. 5A to 5C are cross-sectional views schematically illustrating semiconductor devices according to example embodiments. FIGS. 5B and 5C are enlarged views of portion 'C' and portion 'D' of FIG. 5A, respectively.

Referring to FIGS. 5A to 5C, cell wiring lines 180 may be further disposed on pad regions CP of gate electrodes 130 in a memory cell region CELL of a semiconductor device 100e. The memory cell region CELL may further include gate contact plugs 160 connecting the cell wiring lines 180 and the gate electrodes 130.

The cell wiring lines 180 on the pad regions CP may be electrically connected to the gate electrodes 130 by the gate contact plugs 160, to apply an electrical signal to the gate electrodes 130. In particular, in example embodiments, the gate electrodes 130 may include polycrystalline silicon. Also, as illustrated in FIG. 5B, in a channel structure CH, a gate dielectric layer 145 may entirely extend vertically along a channel layer 140, without a region extending horizontally along the gate electrodes 130.

The gate contact plug 160 may be disposed to fill a third contact hole PH3 passing through a portion of a cell region insulating layer 190, as illustrated in FIG. 5C. The third contact hole PH3 may have a shape in which a lower end recesses the gate electrode 130. The gate contact plug 160 may include a metal silicide layer 162, a first metal nitride layer 164, a second metal nitride layer 166, and a conductive layer 168, sequentially stacked from the gate electrode 130. For example, the gate contact plug 160 may have a stack structure the same or substantially the same as that of a first contact plug 260.

The metal silicide layer 162 may be an ohmic layer, and may be disposed to contact the gate electrode 130. In example embodiments, the metal silicide layer 162 may be disposed to surround a bottom surface and a portion of an external side surface of the third contact hole PH3, but is not limited thereto. For example, the metal silicide layer 162 may have a shape protruded inwardly from the bottom surface and the external side surface of the third contact hole PH3 with a predetermined or alternatively, desired thickness. The metal silicide layer 162 may include titanium silicide (TiSi), tungsten silicide (WSi), nickel silicide (NiSi), cobalt silicide (CoSi), or other metal silicides.

The first metal nitride layer 164 may be disposed to extend from the metal silicide layer 162 along an internal side wall of the third contact hole PH3. The first metal nitride layer 164 may be a nitride layer including the same metal element as the metal silicide layer 162. For example, the metal silicide layer 162 may be a silicide layer of a first metal, and the first metal nitride layer 164 may be a nitride layer of the first metal. For example, the metal silicide layer 162 may be a TiSi$_x$ layer, and the first metal nitride layer 164 may be a TiN layer. The first metal nitride layer 164 may have a ninth thickness T9, greater than an eighth thickness T8 of the metal silicide layer 162. For example, a ratio T8/T9 of the eighth thickness T8 to the ninth thickness T9 may range from about 0.16 to about 0.80.

The second metal nitride layer 166 may be disposed on the first metal nitride layer 164 on the internal side wall of the third contact hole PH3. The second metal nitride layer 166 may have a tenth thickness T10, less than the ninth thickness T9 of the first metal nitride layer 164. According to example embodiments, the tenth thickness T10 may be equal to or greater than the ninth thickness T9. The second metal nitride layer 166 may include the same or different metal element as or from the first metal nitride layer 164. In example embodiments, even when the second metal nitride layer 166 has the same composition as the first metal nitride layer 164, the process operations related to each other may be different such that an interface between them may be distinguished. For example, the first metal nitride layer 164 may be a layer formed by the nitridation process, and the second metal nitride layer 166 may be a layer formed by a CVD process.

The conductive layer 168 may be disposed to partially or completely fill the third contact hole PH3. The conductive layer 168 may include a metal element, different from the metal silicide layer 162 and the first metal nitride layer 164, but is not limited thereto. For example, the conductive layer 168 may include tungsten (W), copper (Cu), or aluminum (Al).

In example embodiments, the channel contact plugs 170 connected to the channel pads 155 may have a structure as illustrated in FIG. 2B or a structure as illustrated in FIG. 4B. For example, when the channel contact plugs 170 are formed together through the same process as the gate contact plugs 160, the channel contact plugs 170 may have a structure as illustrated in FIG. 4B.

Figure 6:
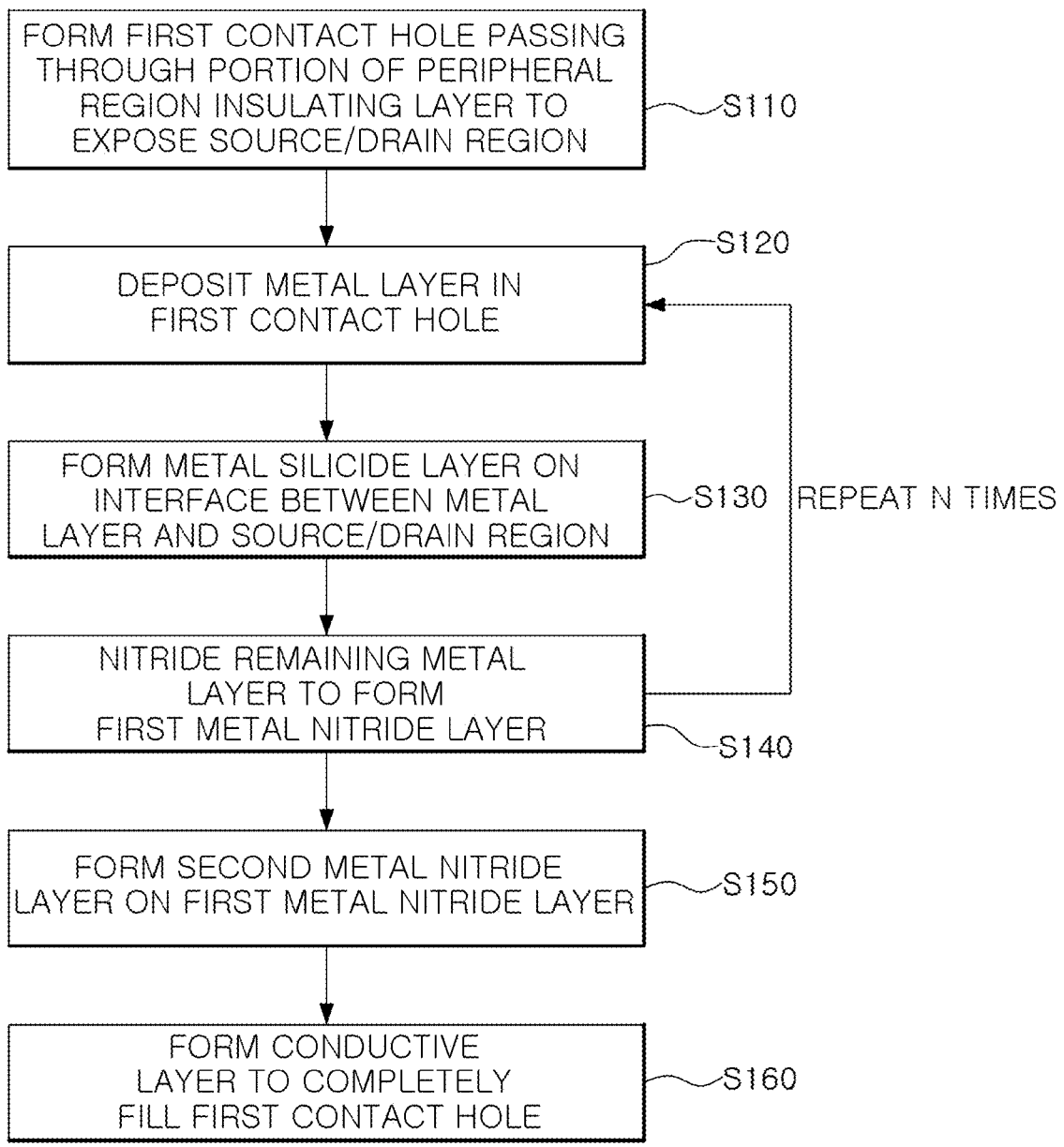
FIG. 6 is a flowchart illustrating a method of manufacturing a semiconductor device according to example embodiments.

FIG. 6 is a flowchart illustrating a method of manufacturing a semiconductor device according to example embodiments.

FIGS. 7A to 7L are cross-sectional views schematically illustrating a method of manufacturing a semiconductor device according to example embodiments. FIGS. 7A to 7L illustrate regions, corresponding to the regions illustrated in FIG. 1.

Figure 7A:
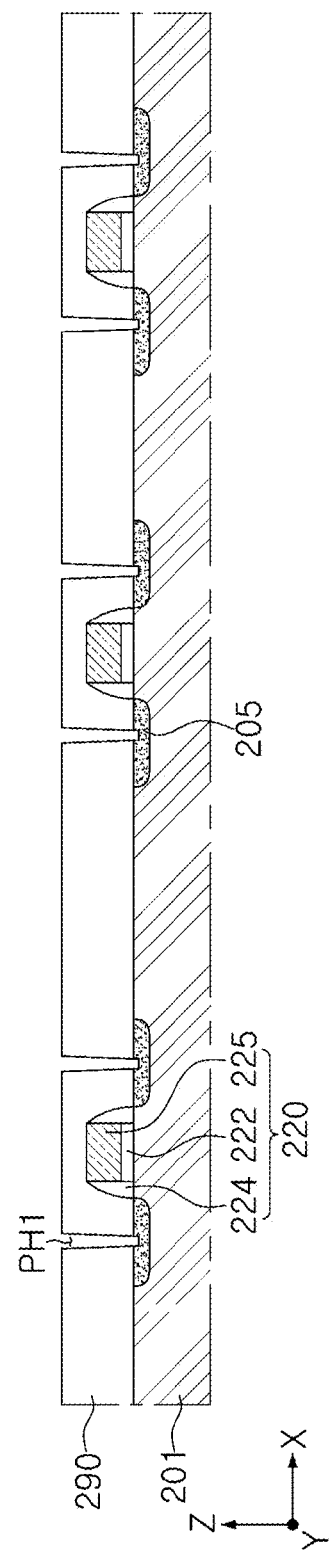
FIGS. 7A to 7L are cross-sectional views schematically illustrating a method of manufacturing a semiconductor device according to example embodiments.

Referring to FIGS. 6 and 7A, circuit elements 220 may be formed on a base substrate 201, a portion of a peripheral region insulating layer 290 may be formed on the base substrate 201, and first contact holes PHI passing through a portion of the peripheral region insulating layer 290 to expose source/drain regions 205 may be formed (S110).

First, a circuit gate dielectric layer 222 and a circuit gate electrode 225 may be sequentially formed on the base substrate 201. The circuit gate dielectric layer 222 and the circuit gate electrode 225 may be formed using an atomic layer deposition (ALD) process or a CVD process. The circuit gate dielectric layer 222 may be formed of silicon oxide, and the circuit gate electrode 225 may be formed of at least one of polycrystalline silicon or a metal silicide layer, but are not limited thereto. Next, spacer layers 224 may be formed on both side walls of the circuit gate dielectric layer 222 and the circuit gate electrode 225. In example embodiments, the spacer layer 224 may be formed of a plurality of layers. Next, the source/drain regions 205 may be formed in the base substrate 201 by performing an ion implantation process.

Next, the first contact holes PH1 may be formed by partially forming the peripheral region insulating layer 290 and then etching the peripheral region insulating layer 290 on the source/drain regions 205 to remove a portion of the peripheral region insulating layer 290. In forming the first contact holes PH1, a second insulating layer 294 (see FIG. 2A) of the peripheral region insulating layer 290 may be used as an etch stop layer.

Figure 7B:
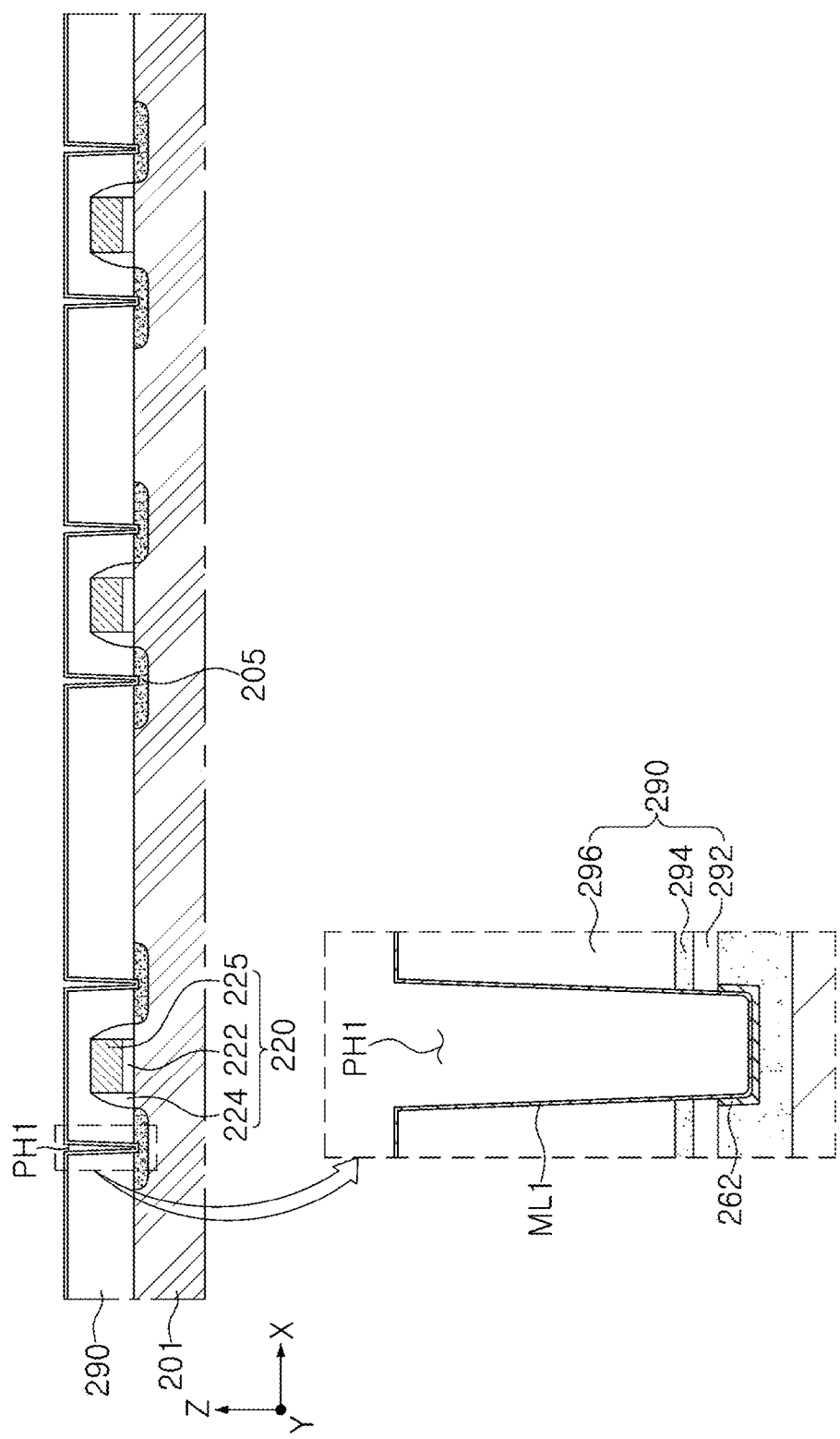

Referring to FIGS. 6 and 7B, a metal layer ML1 may be deposited in the first contact holes PH1, and metal silicide layers 262 may be formed on an interface between the metal layer ML1 and the source/drain regions 205 (S120, S130).

The metal layer ML1 may be deposited using, for example, a plasma enhanced CVD (PECVD) process, but is not limited thereto. The metal layer ML1 may be deposited by a vacuum deposition process, a plating deposition process, an ion implantation process, or the like. For example, when the metal layer ML1 is a titanium (Ti) layer and the metal silicide layers 262 are titanium silicide (TiSi$_x$) layers, TiC14, a precursor of titanium, and hydrogen (H2), a reaction gas, may be injected into a manufacturing chamber.

The metal silicide layers 262 may be formed by a reaction of the metal layer ML1 and the source/drain regions 205, and thus may be formed by consuming the source/drain regions 205 to a predetermined or alternatively, desired depth. The metal silicide layers 262 may be formed during the deposition of the metal layer ML1, may be formed by a separate heat treatment process or a subsequent high temperature process after the deposition of the metal layer ML1, or may be formed during the deposition of the metal layer ML1 and during the high temperature process after the deposition of the metal layer ML1. In example embodiments, a thickness of the metal layer ML1 remaining in a region contacting the metal silicide layers 262 may be thinner than in other regions. In addition, the thickness of the remaining metal layer ML1 may be in a range of about ⅙ to about ¼ of a thickness of the metal silicide layer 262, and may be relatively thinner than the metal silicide layer 262.

Figure 7C:
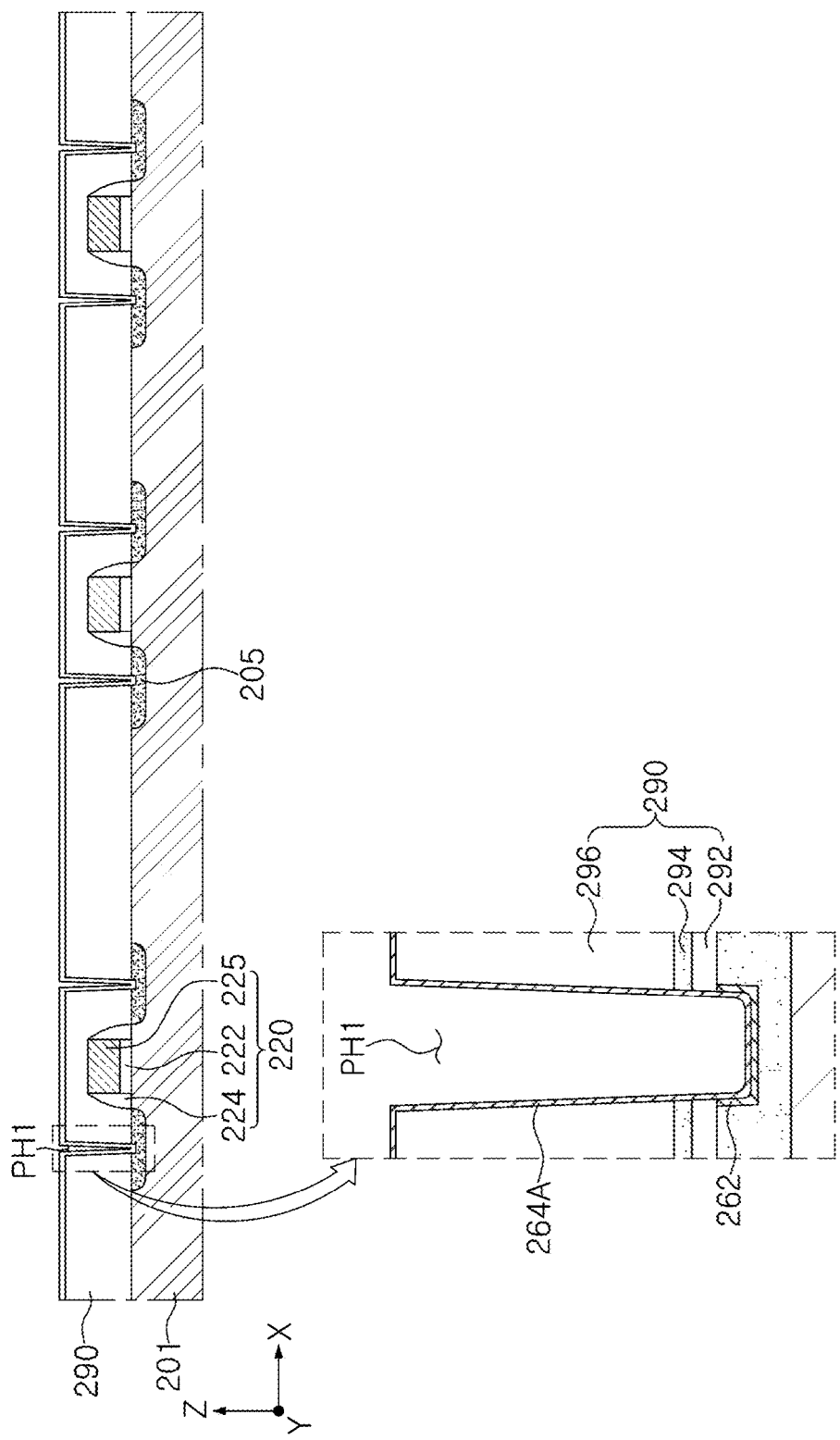

Referring to FIGS. 6 and 7C, the remaining metal layer ML1 in the first contact holes PH1 may be nitrided to form a first metal nitride layer 264A (S140).

The first metal nitride layer 264A may be formed by nitriding the metal layer ML1 using a gas phase nitriding reaction or using a separate n-rich nitride film. For example, the first metal nitride layer 264A may be formed by a plasma nitriding process using RF plasma. In example embodiments, the remaining metal layer ML1 may be nitrided by supplying, for example, NH3 into the manufacturing chamber. In example embodiments, this process operation may be performed in the same manufacturing chamber as the process of forming the metal layer ML1 described above with reference to FIG. 7B, but is not limited thereto.

The first metal nitride layer 264A may be formed to have a thickness, similar to or thicker than that of the remaining metal layer ML1. In this way, occurrence of lifting the metal layer ML1 may be reduced or prevented during the subsequent process, or the metal layer ML1 may be reduced or prevented from being oxidized to form an oxide layer, by nitriding the remaining metal layer ML1. Therefore, reliability of the semiconductor device may be improved.

Figure 7D:
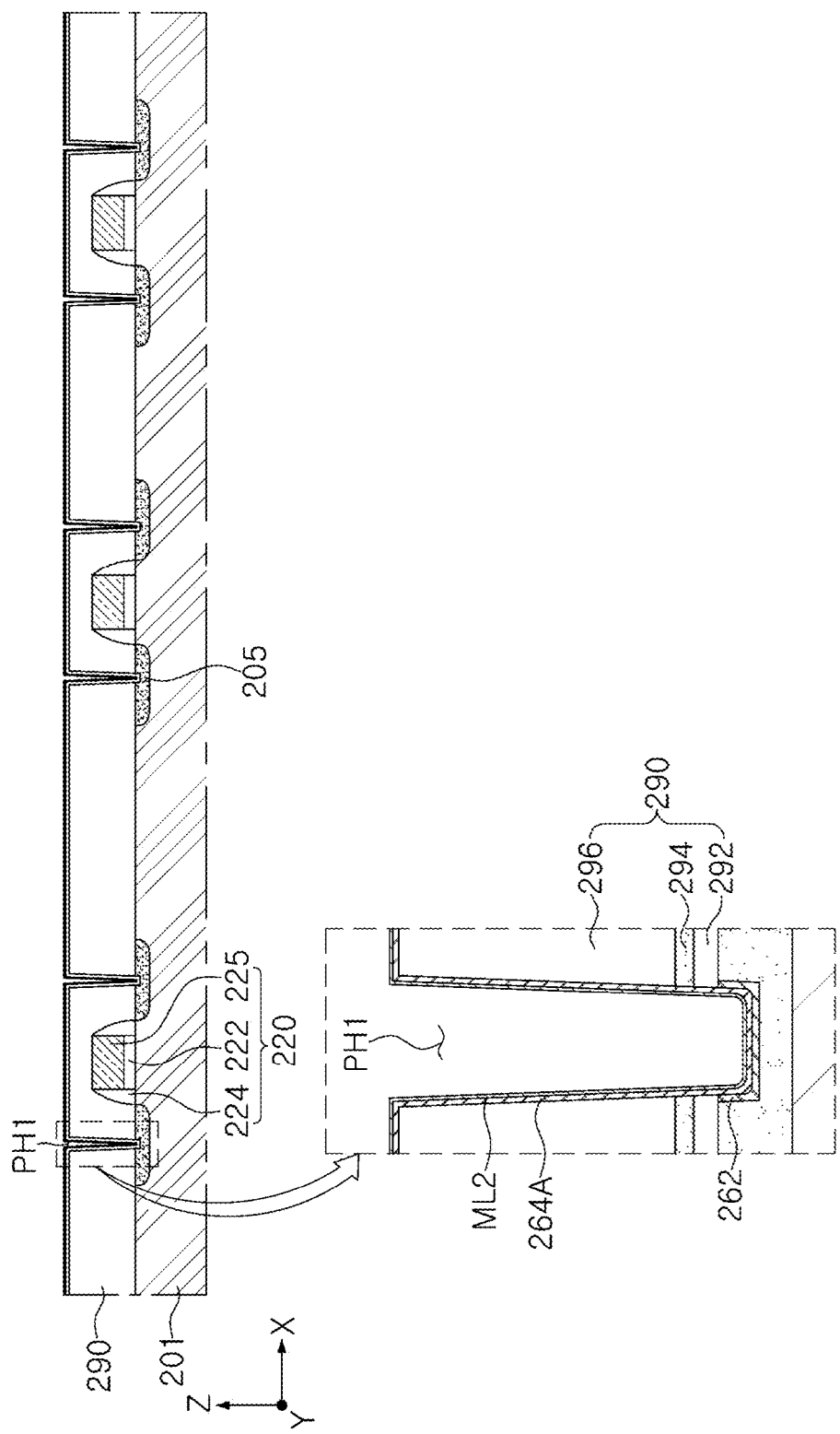
Figure 7E:
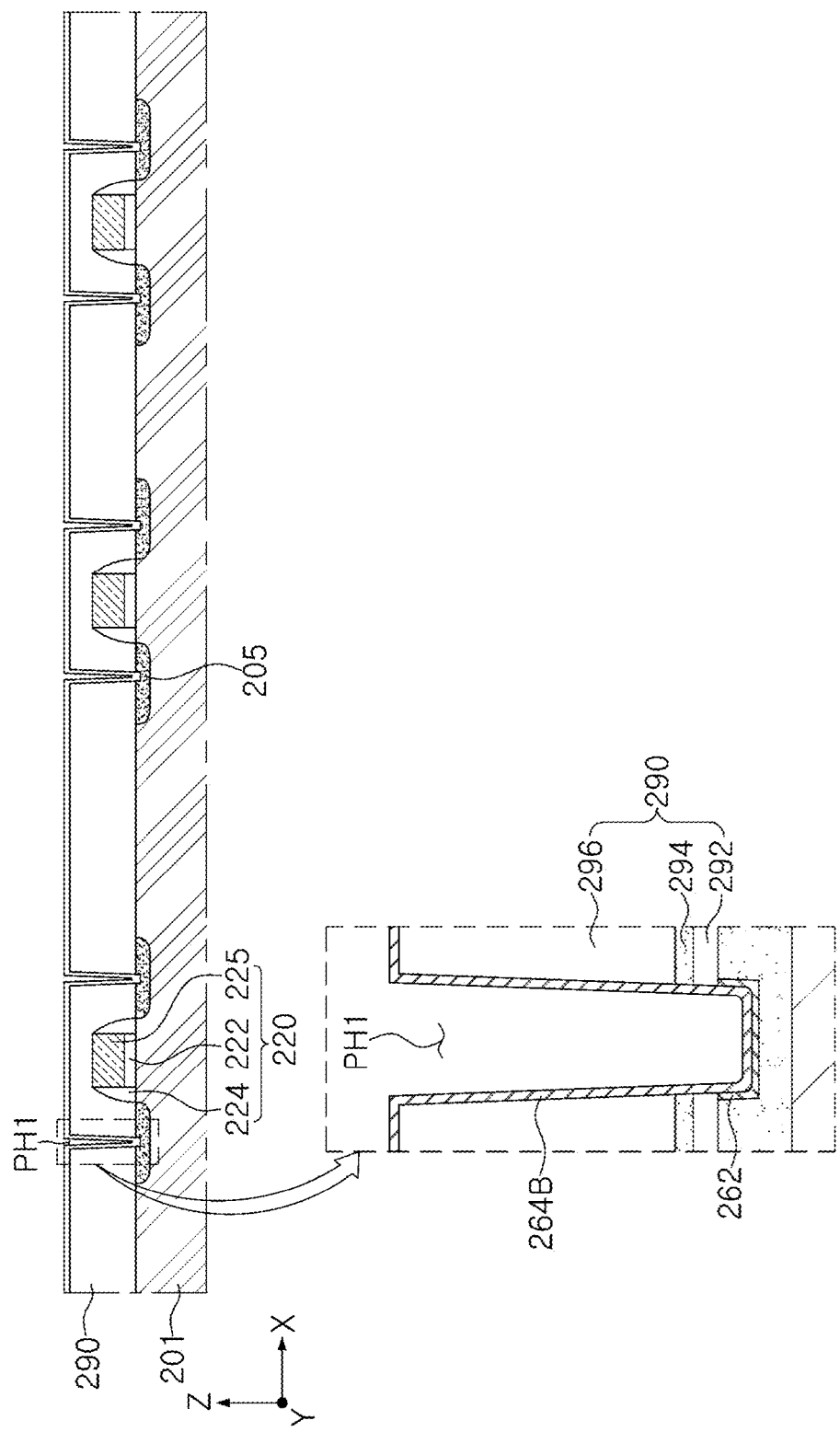

Referring to FIGS. 6, 7D, and 7E, the process operations described above may be repeatedly performed with reference to FIGS. 7B and 7C. As illustrated in FIG. 7D, a metal layer ML2 may be deposited on the first metal nitride layer 264A, and as illustrated in FIG. 7E, a first metal nitride layer 264B, thicker than the first metal nitride layer 264A, may be formed by performing a nitriding process on the remaining metal layer ML2. The first metal nitride layer 264B may be a layer formed by combining the first metal nitride layer 264A of FIG. 7C and a metal nitride layer formed by nitriding the remaining metal layer ML2.

The metal layer ML2 may be formed again on the first metal nitride layer 264A to diffuse a metal element from the metal layer ML2 in a downward direction to react with the source/drain regions 205. Therefore, metal silicide may be additionally formed, in a region in which the metal silicide layer 262 is not formed or in a region in which the metal silicide layer 262 is formed in a relatively thin state, to reinforce the metal silicide layer 262. Therefore, the metal silicide layer 262 finally formed may maintain a continuous thin film state with a uniform or substantially uniform thickness without agglomeration even after subsequent processes of 600° C. or more.

In a case of the metal silicide layer 262, when the metal silicide layer 262 is aggregated and gets relatively thicker, dopants contained in the source/drain region 205 may be sucked to bring a loss of the dopants of the source/drain region 205, to increase contact resistance. Formation and nitridation processes of the metal layers ML1 and ML2 may be repeatedly performed, to form a metal silicide layer 262 with improved uniformity, thereby ensuring the contact resistance. In particular, even in a case of a subsequent formation of the memory cell region CELL (see FIG. 1), even when a relatively high temperature process is performed several times, such as a process of forming channel structures CH and gate electrodes 130, contact resistance of the first contact plugs 260 may be secured. In fact, when a contact plug is formed by repeatedly performing the process operations five times, the contact resistance may be reduced by about half, compared to the case in which the process operations are performed once under the same conditions.

The process operations of S120 to S140 of FIG. 6 may be repeated n times. In example embodiments, n may be in the range of 2 to 50, especially 5 or more, and may be selected in consideration of a size of the first contact hole PH1, a thickness of each thin film layer, and/or contact resistance. As the process operations of S120 to S140 are repeatedly performed, a thickness of a first metal nitride layer 264 may increase, and may vary depending on the metal material, but may be thicker than a thickness of the metal silicide layer 262. For example, in a case that the metal silicide layers 262 is titanium silicide (TiSix) and the first metal nitride layer 264 is titanium nitride (TiN), when the process operations are repeated five or more times, the thickness of the first metal nitride layer 264 may be thicker than the thickness of the metal silicide layer 262.

Figure 7F:
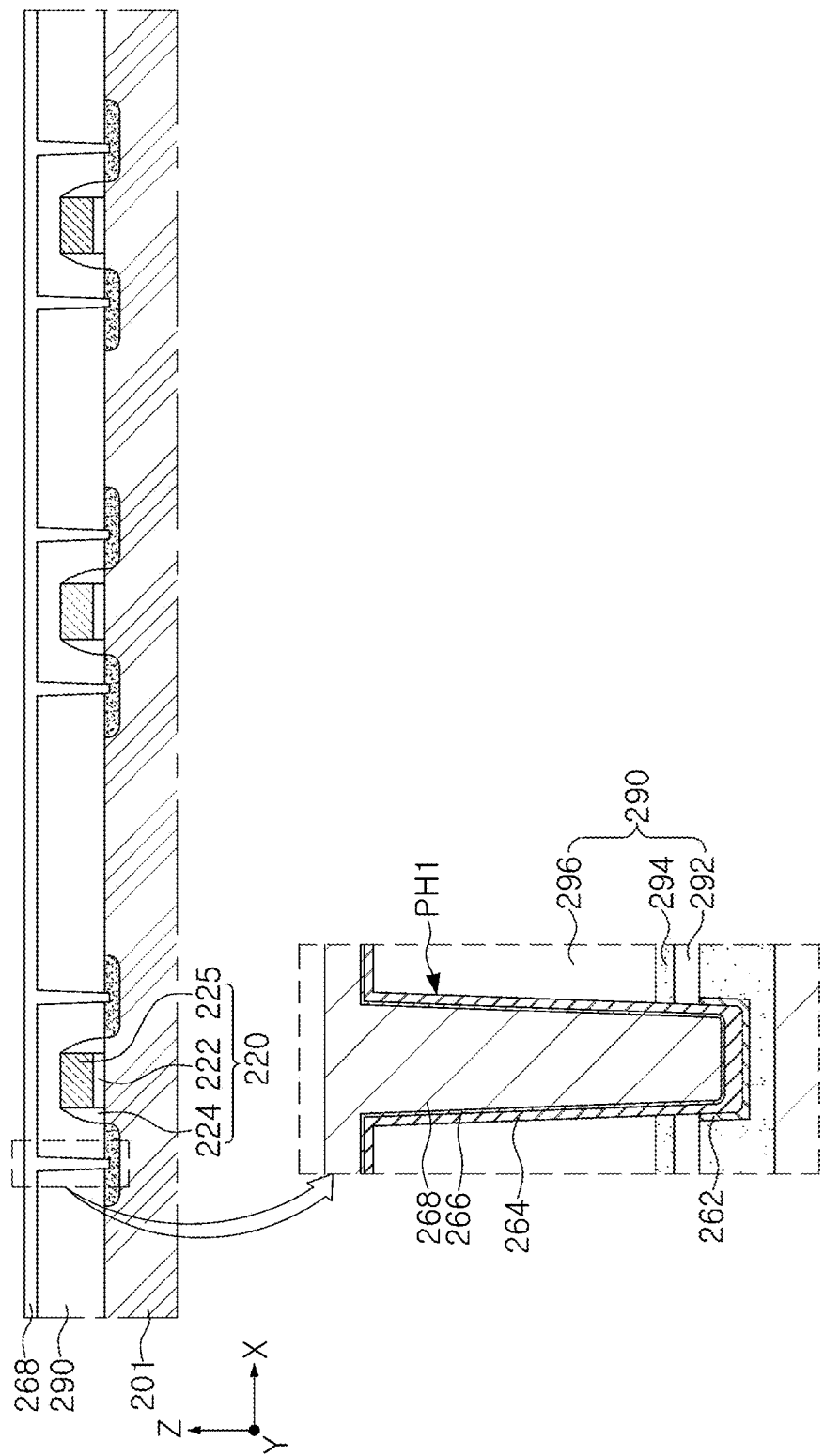

Referring to FIGS. 6 and 7F, a second metal nitride layer 266 and a conductive layer 268 are formed on the first metal nitride layer 264 which is formed by repeatedly performing the formation and nitridation of the metal layers ML1 and ML2 (S150 and S160).

The second metal nitride layer 266 may be formed in the same manufacturing chamber as the manufacturing chamber in which the first metal nitride layer 264 is formed, or may be formed in another manufacturing chamber. The second metal nitride layer 266 may be deposited by, for example, a CVD process. As in example embodiments of FIG. 3B, deposition of the second metal nitride layer 266 may be omitted according to example embodiments. For example, both the first metal nitride layer 264 and the second metal nitride layer 266 may have a crystalline structure. In example embodiments, since the first metal nitride layer 264 and the second metal nitride layer 266 may be formed at different process operations, crystal structures thereof may be discontinuous.

The conductive layer 268 may be formed to partially or completely fill the first contact holes PH1. The conductive layer 268 may be deposited by, for example, a CVD process or a PVD process.

Next, the first contact plugs 260 may be formed by removing materials deposited on the peripheral region insulating layer 290 by a planarization process.

Figure 7G:
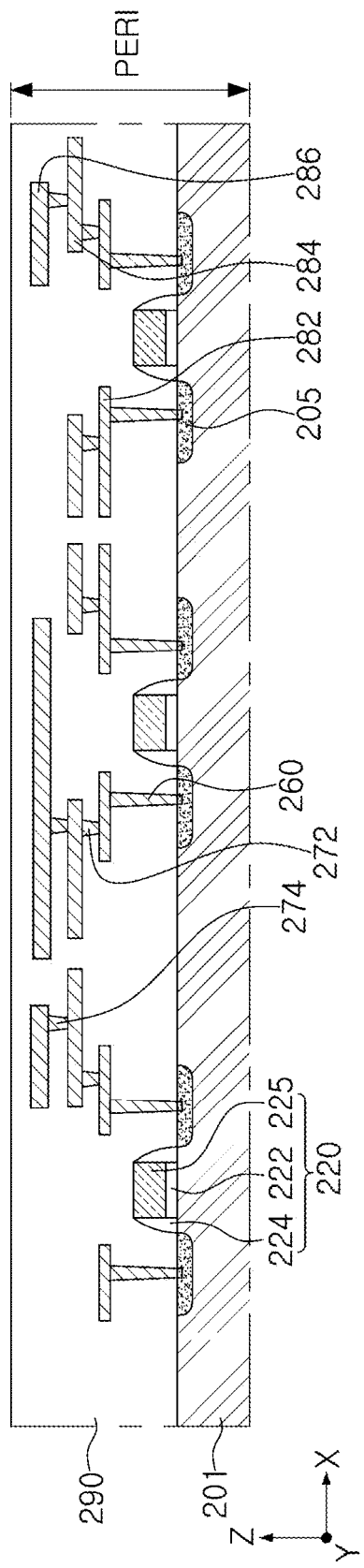

Referring to FIG. 7G, second and third contact plugs 272 and 274, and first to third circuit wiring lines 282, 284, and 286 may be formed on the first contact plugs 260 to form a peripheral circuit region PERI.

The second and third contact plugs 272 and 274 and the first to third circuit wiring lines 282, 284, and 286 may be formed by, for example, depositing a conductive material and patterning the deposited conductive material.

The peripheral region insulating layer 290 may be formed of a plurality of insulating layers. The peripheral region insulating layer 290 may be partially formed in the formation of each of the second and third contact plugs 272 and 274 and the first to third circuit wiring lines 282, 284, and 286 constituting wiring structures, and may be formed to finally cover the circuit elements 220 and the wiring structures by partially forming in an upper portion of the third circuit wiring line 286.

Figure 7H:
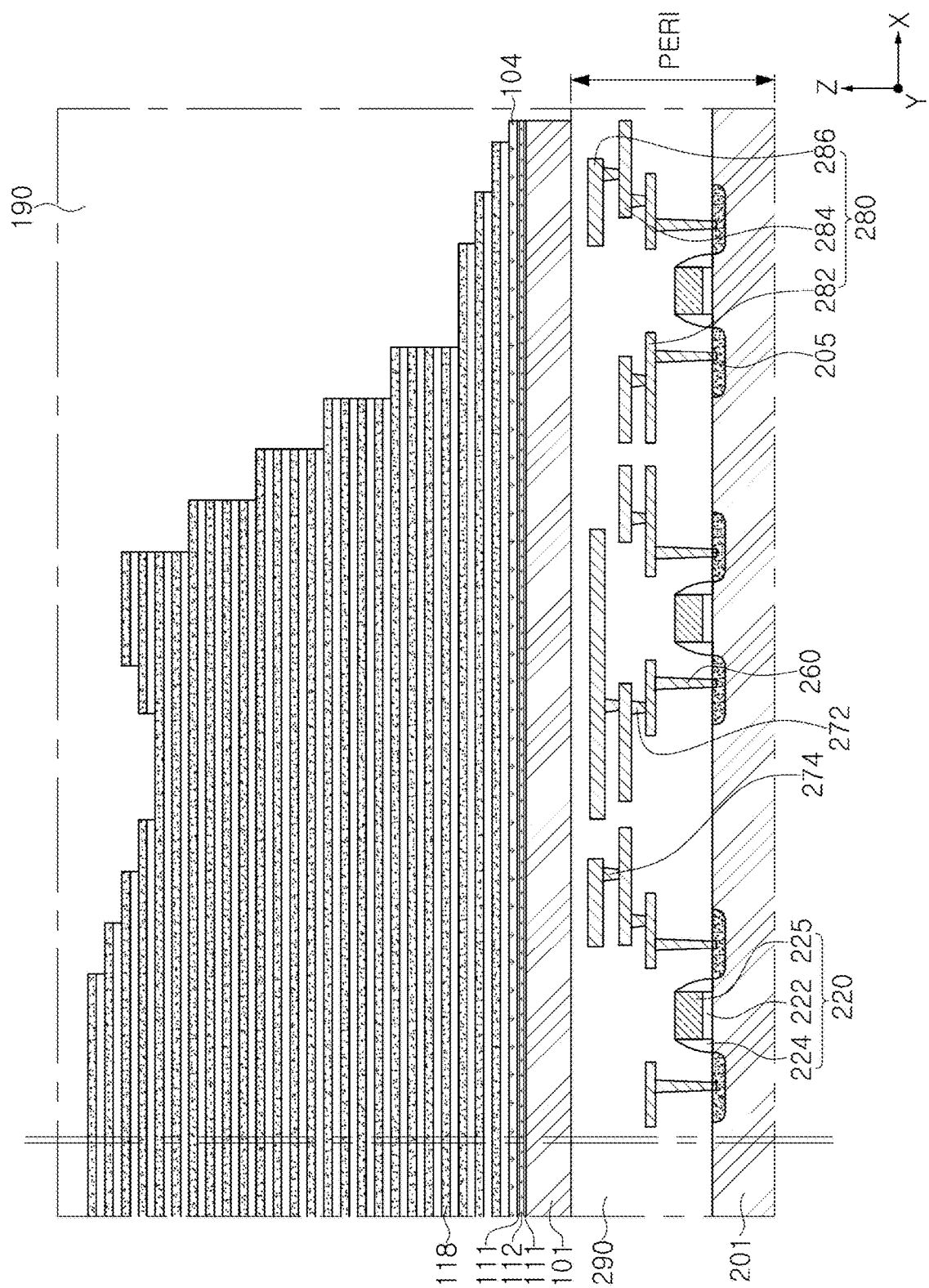

Referring to FIG. 7H, after forming a substrate 101 on which the memory cell region is provided, first and second horizontal sacrificial layers 111 and 112, and a second horizontal conductive layer 104 may be formed on the peripheral circuit region PERI, and gate sacrificial layers 118 and interlayer insulating layers 120 may be alternately stacked.

The substrate 101 may be formed on the peripheral region insulating layer 290. The substrate 101 may be made of polycrystalline silicon, for example, and may be formed by, for example, a CVD process. The polycrystalline silicon constituting the substrate 101 may include impurities. The substrate 101 may be formed by patterning the substrate 101 to a size smaller than that of the base substrate 201.

The first and second horizontal sacrificial layers 111 and 112 may be formed on the substrate 101, and may be stacked such that the first horizontal sacrificial layers 111 are disposed above and below the second horizontal sacrificial layer 112. The first and second horizontal sacrificial layers 111 and 112 may include different materials. The first and second horizontal sacrificial layers 111 and 112 may be layers to be replaced with the first horizontal conductive layer 102 of FIG. 1 through a subsequent process. For example, the first horizontal sacrificial layer 111 may be made of the same material as the interlayer insulating layers 120, and the second horizontal sacrificial layer 112 may be made of the same material as the gate sacrificial layers 118. The second horizontal conductive layer 104 may be deposited on the first and second horizontal sacrificial layers 111 and 112.

The gate sacrificial layers 118 may be layers be replaced with the gate electrodes 130 (see FIG. 1). The gate sacrificial layers 118 may be formed of a material, different from that of the interlayer insulating layers 120, and may be formed of a material that may be etched with etch selectivity under specific etching conditions with respect to the interlayer insulating layers 120. For example, the interlayer insulating layer 120 may be formed of at least one of silicon oxide and silicon nitride, and the gate sacrificial layers 118 may be formed of a material selected from silicon, silicon oxide, silicon carbide, and silicon nitride, which is different from a material of the interlayer insulating layer 120. In example embodiments, thicknesses and the number of the interlayer insulating layers 120 and the gate sacrificial layers 118 may vary, based on those illustrated. Photolithography and etching processes for the gate sacrificial layers 118 may be repeatedly performed using a mask layer such that the gate sacrificial layers 118 in an upper portion extend shorter than the gate sacrificial layers 118 in a lower portion. As a result, the gate sacrificial layers 118 may have a stepped shape.

Next, a cell region insulating layer 190 may be formed to cover a stack structure of the gate sacrificial layers 118 and the interlayer insulating layers 120.

Figure 7I:
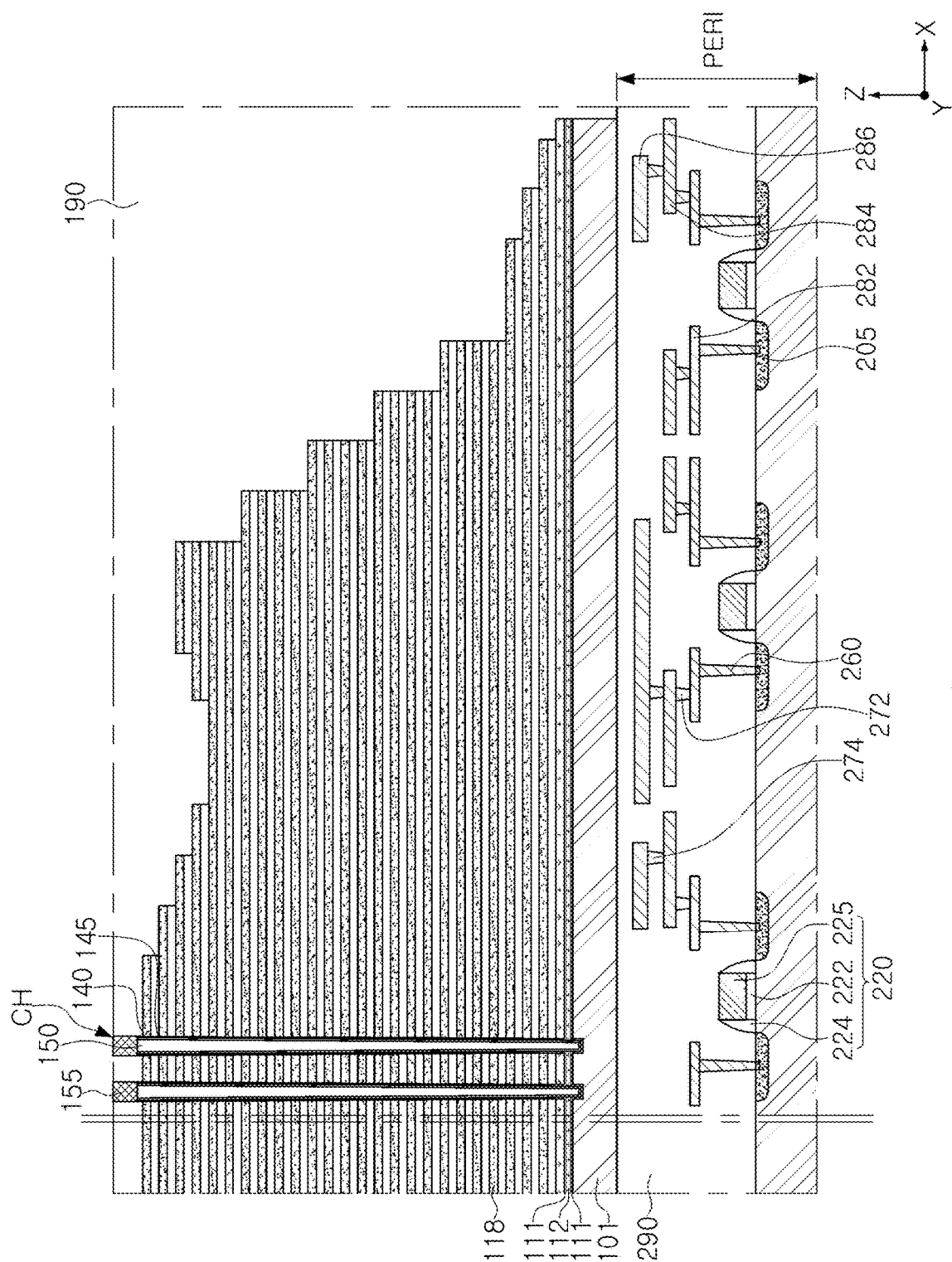

Referring to FIG. 7I, channel structures CH may be formed through the stack structure of the gate sacrificial layers 118 and the interlayer insulating layers 120.

First, a mask layer including an amorphous carbon layer (ACL) may be formed on the cell region insulating layer 190, and channel holes may be formed by an anisotropic etching process using the mask layer. Due to a height of the stack structure, side walls of the channel holes may not be perpendicular to an upper surface of the substrate 101. The channel holes may be formed to recess a portion of the substrate 101.

Next, at least a portion of a gate dielectric layer 145, a channel layer 140, a channel insulating layer 150, and channel pads 155 may be sequentially formed in the channel holes to form the channel structures CH.

The gate dielectric layer 145 may be formed to have a uniform thickness using an ALD or CVD process. In this operation, all or portion of the gate dielectric layer 145 extending perpendicularly to the substrate 101 along the channel structures CH may be formed. The channel layer 140 may be formed on the gate dielectric layer 145 in the channel structures CH. The channel insulating layer 150 may be formed to fill the channel structures CH, and may be an insulating material. In example embodiments, inside of the channel layers 140 may be filled with a conductive material, instead of the channel insulating layer 150. The channel pad 155 may be made of a conductive material, and may be, for example, made of polycrystalline silicon.

Figure 7J:
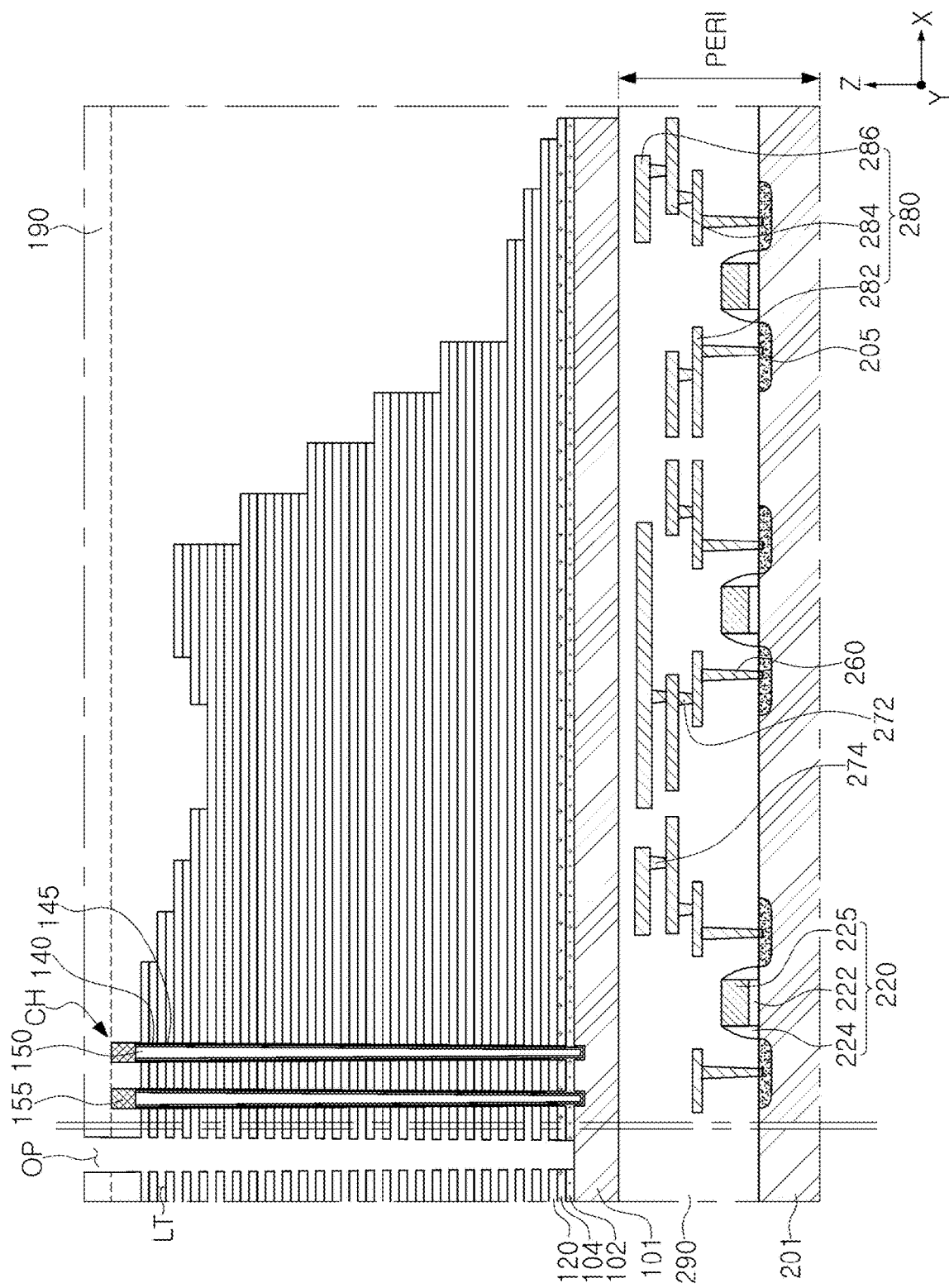

Referring to FIG. 7J, an opening OP may be formed to pass through the stack structure of the gate sacrificial layers 118 and the interlayer insulating layers 120, and the gate sacrificial layers 118 may be removed through the opening OP.

First, before forming the opening OP, the cell region insulating layer 190 may be further formed on the channel structures CH. After separate sacrificial spacer layers are formed in the opening OP, the second horizontal sacrificial layer 112 may be selectively removed through the opening OP, and the first horizontal sacrificial layers 111 may be removed. The first and second horizontal sacrificial layers 111 and 112 may be removed by, for example, a wet etching process. In the removal process of the first horizontal sacrificial layers 111, a portion of the gate dielectric layer 145 exposed in a region in which the second horizontal sacrificial layer 112 is removed may also be removed. After forming the first horizontal conductive layer 102 by depositing a conductive material in a region in which the first and second horizontal sacrificial layers 111 and 112 are removed, the sacrificial spacer layers may be removed in the opening OP.

Next, side openings LT may be formed by removing the gate sacrificial layers 118 through the opening OP. The gate sacrificial layers 118 may be selectively removed with respect to the interlayer insulating layers 120 and the first and second horizontal conductive layers 102 and 104, for example, using a wet etching process. Therefore, the side opening LT may be formed in plural, between the interlayer insulating layers 120, and a portion of the side walls of the channel structures CH may be exposed through the side openings LT.

Figure 7K:
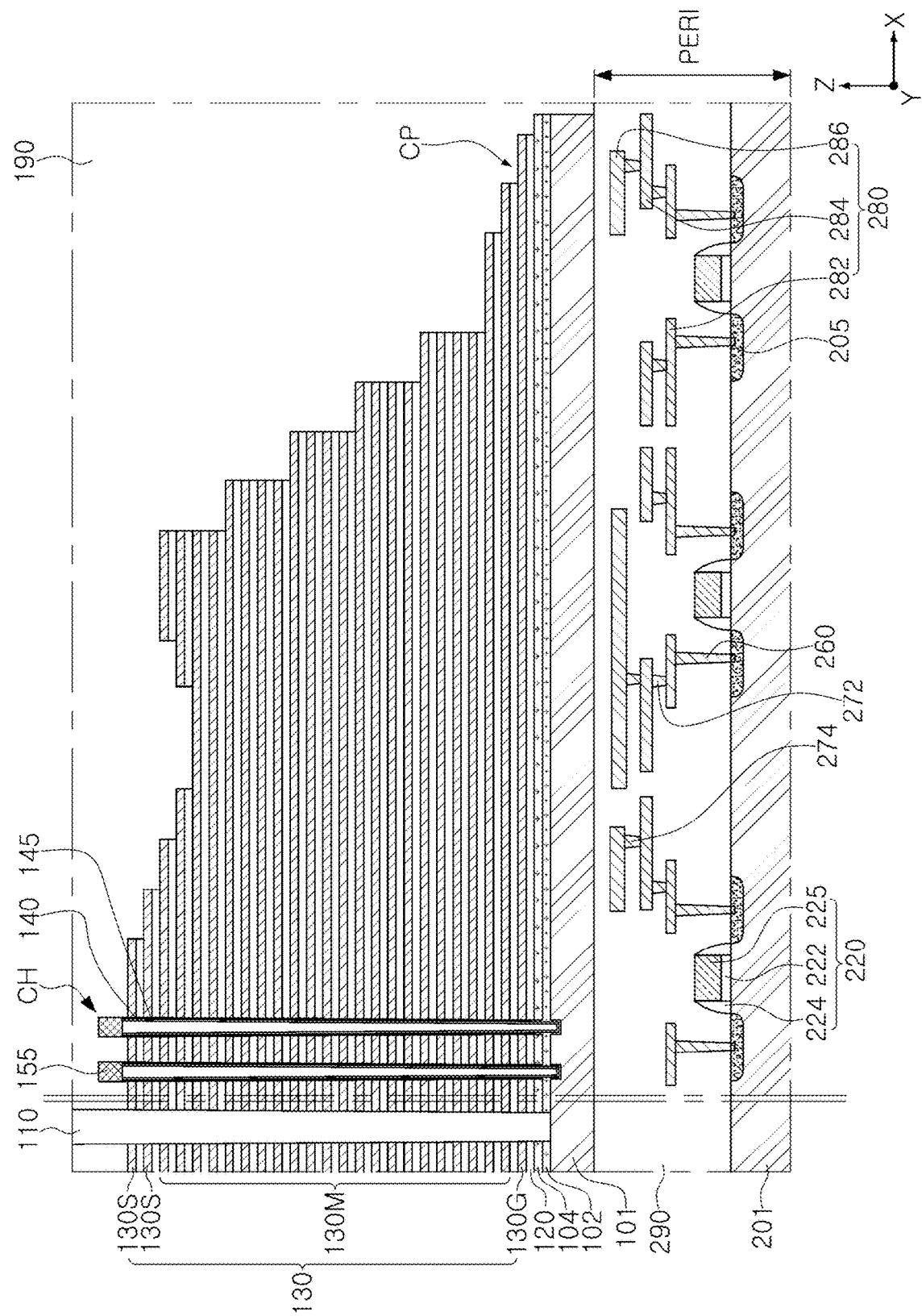

Referring to FIG. 7K, gate electrodes 130 may be formed by filling conductive materials in the side openings LT, and an insulating material may be deposited in the opening OP to form a separation region 110.

The conductive materials forming the gate electrodes 130 may fill the side openings LT. The conductive materials may include a metal, polycrystalline silicon, or a metal silicide material. After the gate electrodes 130 are formed, the conductive material deposited in the opening OP may be removed through an additional process.

According to example embodiments, the separation region 110 may be formed to include a conductive layer therein as well as an insulating material. In example embodiments, the conductive layer may be used as a common source line or a kind of contact plug for the common source line.

Figure 7L:
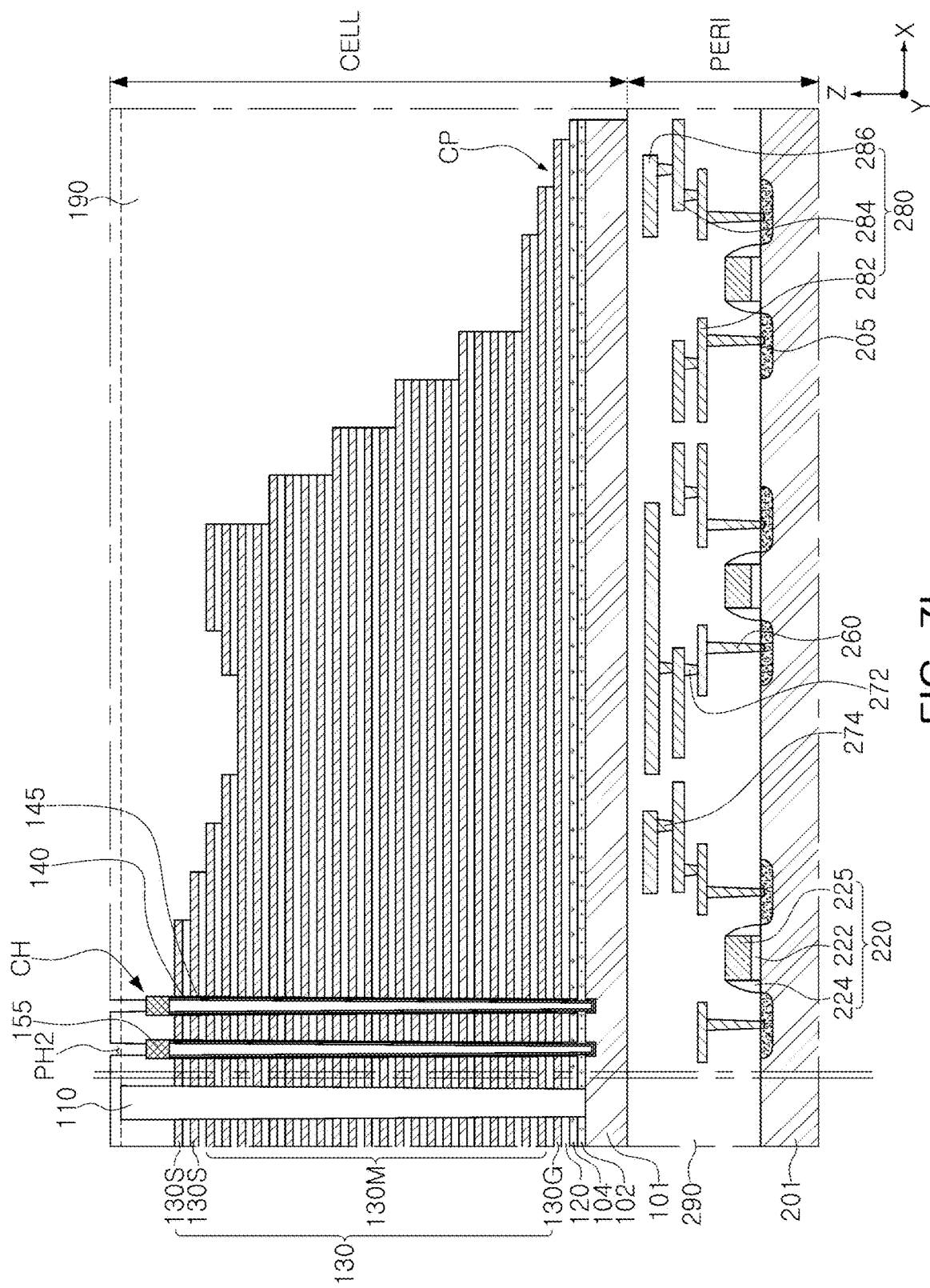

Referring to FIG. 7L, second contact holes PH2 passing through a portion of the cell region insulating layer 190 may be formed.

First, before forming the second contact holes PH2, a cell region insulating layer 190 may be further formed on the separation region 110. The second contact holes PH2 may extend from an upper portion of the cell region insulating layer 190 to expose the channel pads 155.

Next, referring to FIG. 1 together, channel contact plugs 170 may be formed by filling the second contact holes PH2, and cell wiring lines 180 may be formed on the channel contact plugs 170. The channel contact plugs 170 may be prepared by depositing a metal layer to form a metal silicide layer 172, and nitriding remaining portion of the metal layer to form a first metal nitride layer 174, in a similar manner to those described above with reference to FIGS. 7B and 7C, and then, by forming a second metal nitride layer 176 and a conductive layer 178, in a similar manner to those described above with reference to FIG. 7F. In the channel contact plugs 170, deposition and nitridation processes of the metal layer may be not repeatedly performed, as illustrated in FIGS. 7D and 7E. According to example embodiments, to improve reliability of the metal silicide layer 172, the channel contact plugs 170 may be formed in a similar manner to the first contact plugs 260. In example embodiments, as in example embodiments of FIGS. 4A and 4B, a thickness of the first metal nitride layer 174 may be formed relatively thicker than a thickness of the metal silicide layer 172.

Figure 8:
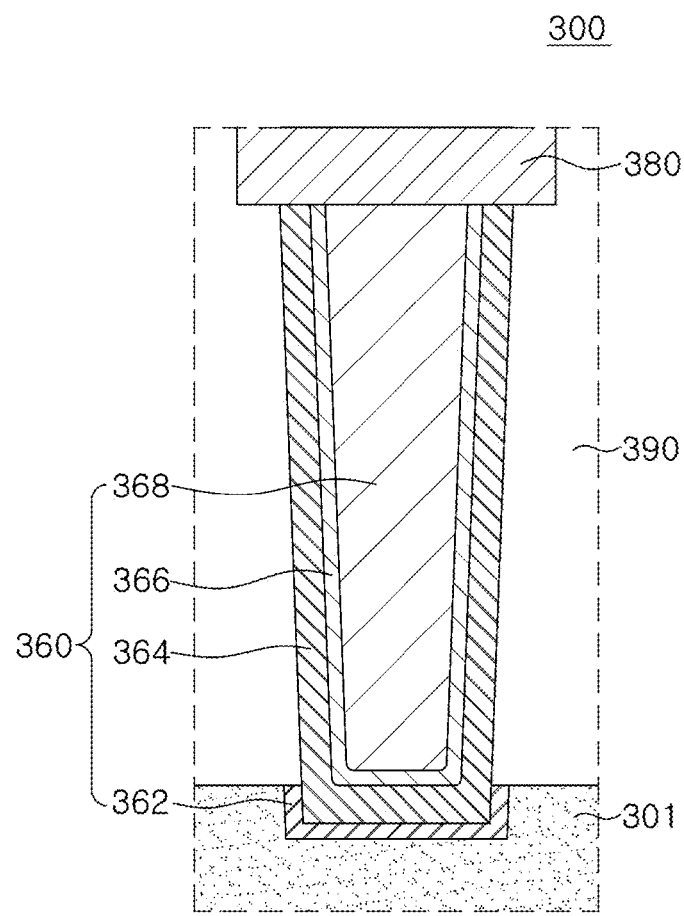
FIG. 8 is a cross-sectional view schematically illustrating a semiconductor device according to example embodiments.

FIG. 8 is a cross-sectional view schematically illustrating a semiconductor device according to example embodiments.

Referring to FIG. 8, a semiconductor device 300 may include a first conductive layer 301, an insulating layer 390 on the first conductive layer 301, a contact plug 360 passing through the insulating layer 390 to be connected to the first conductive layer 301, and a third conductive layer 380 on the contact plug 360.

Each of the first conductive layer 301 and the third conductive layer 380 may form a wiring region or a conductive region of elements, in the semiconductor device 300. The first conductive layer 301 may include a conductive material, for example, a semiconductor material. The third conductive layer 380 may include a conductive material, for example, a semiconductor or metal material.

The insulating layer 390 may be disposed to surround the contact plug 360 between the first conductive layer 301 and the third conductive layer 380, and may be formed of an insulating material such as silicon nitride, silicon oxide, or silicon oxynitride.

The contact plug 360 may be configured to fill a contact hole passing through at least a portion of the insulating layer 390, and electrically and physically connect the first conductive layers 301 and the third conductive layer 380, the two components in the semiconductor device 300. In particular, the contact plug 360 may have a relatively large aspect ratio, and may have a structure having a length in a vertical direction, greater than a diameter of the contact hole. The contact plug 360 may have a structure for lowering contact resistance with the first conductive layer 301 which is formed of a semiconductor material. Specifically, the contact plug 360 may include a metal silicide layer 362, a first metal nitride layer 364, a second metal nitride layer 366, and a second conductive layer 368, sequentially stacked from the first conductive layer 301. Description of each layer of the contact plug 360 may be equally applicable to the description of the first contact plug 260 described above with reference to FIG. 1.

In a contact plug, by improving or optimizing structures of a metal silicide layer formed on an interface with a semiconductor layer and a metal nitride layer, a semiconductor device with improved reliability may be provided.

Various and advantageous advantages and effects of the present inventive concepts are not limited to the above description, it will be more readily understood in a process of describing example embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
a peripheral circuit region comprising a first substrate, circuit elements on the first substrate, a first insulating layer covering the circuit elements, and a contact plug passing through at least a portion of the first insulating layer on a side of the circuit elements and disposed to be connected to the first substrate; and
a memory cell region comprising a second substrate above the first substrate, gate electrodes on the second substrate, spaced apart from each other, and stacked in a vertical direction, and channel structures passing through the gate electrodes and extending perpendicularly to an upper surface of the second substrate,
wherein the memory cell region further comprises a second insulating layer covering the channel structures, and channel contact plugs disposed to be connected to the channel structures through at least a portion of the second insulating layer, wherein the channel contact plugs comprise an upper metal silicide layer disposed to contact the channel structures, an upper metal nitride layer on the upper metal silicide layer to contact the upper metal silicide layer, and an upper conductive layer on the upper metal nitride layer,
wherein the contact plug comprises a metal silicide layer disposed to contact the first substrate and having a first thickness, a first metal nitride layer on the metal silicide layer to contact the metal silicide layer and having a second thickness, greater than the first thickness, a second metal nitride layer on the first metal nitride layer, and a conductive layer on the second metal nitride layer.

2. The semiconductor device according to claim 1, wherein the contact plug is disposed to fill a contact hole recessing the first substrate,
wherein the metal silicide layer is disposed to surround a bottom surface and an external side surface of the contact hole at a lower end of the contact hole.

3. The semiconductor device according to claim 1, wherein a ratio of the first thickness to the second thickness ranges from about 0.16 to about 0.80.

4. The semiconductor device according to claim 3, wherein the second thickness ranges from about 80 Å to about 140 Å.

5. The semiconductor device according to claim 1, wherein the metal silicide layer, the first metal nitride layer, and the second metal nitride layer comprise a first metal, and the conductive layer comprises a second metal, different from the first metal.

6. The semiconductor device according to claim 1, wherein the second metal nitride layer has a third thickness, less than the second thickness.

7. The semiconductor device according to claim 1, wherein the upper metal silicide layer has a fourth thickness, and the upper metal nitride layer has a fifth thickness, less than the fourth thickness.

8. The semiconductor device according to claim 1, wherein the upper metal nitride layer comprises a first layer and a second layer, sequentially stacked,
wherein the upper metal silicide layer has a fourth thickness, and the first layer has a fifth thickness, less than the fourth thickness.

9. The semiconductor device according to claim 8, wherein a ratio of the fourth thickness to the fifth thickness ranges from about 2 to about 8.

10. The semiconductor device according to claim 1, wherein an uppermost surface of the metal silicide layer is substantially coplanar with an upper surface of the first substrate.

11. The semiconductor device according to claim 1, wherein an uppermost surface of the metal silicide layer is in contact with the first insulating layer.

12. A semiconductor device comprising:
a peripheral circuit region comprising a first substrate, circuit elements on the first substrate, a first insulating layer covering the circuit elements, and a first contact plug passing through at least a portion of the first insulating layer on a side of the circuit elements and disposed to be connected to the first substrate; and
a memory cell region comprising a second substrate above the first substrate, memory cells on the second substrate and electrically connected to the circuit elements, a second insulating layer covering the memory cells, and a second contact plug passing through at least a portion of the second insulating layer and electrically connected to the memory cells,
wherein the memory cell region further comprises gate electrodes on the second substrate, spaced apart from each other, and stacked in a vertical direction, channel structures passing through the gate electrodes and extending perpendicularly to an upper surface of the second substrate, the second insulating layer covering the channel structures, channel contact plugs disposed to be connected to the channel structures through at least a portion of the second insulating layer, wherein the channel contact plugs comprise an upper metal silicide layer disposed to contact the channel structures, an upper metal nitride layer on the upper metal silicide layer to contact the upper metal silicide layer, and an upper conductive layer on the upper metal nitride layer, wherein at least one of the first contact plug and the second contact plug comprises a metal silicide layer having a first thickness, a metal nitride layer on the metal silicide layer to contact the metal silicide layer and having a second thickness, greater than the first thickness, and a conductive layer on the metal nitride layer.

13. The semiconductor device according to claim 12, wherein the first contact plug comprises the metal silicide layer, the metal nitride layer, and the conductive layer, and the second contact plug comprises an upper metal silicide layer having a third thickness, an upper metal nitride layer on the upper metal silicide layer to contact the upper metal silicide layer and having a fourth thickness, less than the third thickness, and a upper conductive layer on the upper metal nitride layer.

14. The semiconductor device according to claim 12, wherein
  the second contact plug is connected to the gate electrodes.

15. The semiconductor device according to claim 12, wherein the first substrate comprises impurity regions adjacent to the circuit elements,
  wherein the first contact plug is connected to the impurity regions.

16. The semiconductor device according to claim 12, wherein the first contact plug comprises the metal silicide layer, the metal nitride layer, and the conductive layer,
  wherein the metal silicide layer is in the first substrate not to extend to an upper portion of the first substrate.

* * * * *